(12) United States Patent
Gramarossa et al.

(10) Patent No.: US 6,524,463 B2
(45) Date of Patent: Feb. 25, 2003

(54) METHOD OF PROCESSING WAFERS AND OTHER PLANAR ARTICLES WITHIN A PROCESSING CELL

(75) Inventors: Daniel J. Gramarossa, Moorpark, CA (US); Gary C. Downes, Moorpark, CA (US)

(73) Assignee: Technic, Inc., Cranston, RI (US)

( * ) Notice: Subject to any disclaimer, the term of this patent is extended or adjusted under 35 U.S.C. 154(b) by 0 days.

(21) Appl. No.: 09/907,258

(22) Filed: Jul. 16, 2001

(65) Prior Publication Data

US 2003/0010643 A1 Jan. 16, 2003

(51) Int. Cl.⁷ .......................... C25D 5/00; C25D 17/28; B05D 1/18
(52) U.S. Cl. ...................... 205/137; 205/145; 427/430.1
(58) Field of Search ...................... 427/430.1; 205/137, 205/145

(56) References Cited

U.S. PATENT DOCUMENTS

| | | |
|---|---|---|
| 3,602,192 A | 8/1971 | Grochowski et al. |
| 3,967,000 A | 6/1976 | Klein et al. |
| 4,262,044 A | 4/1981 | Kuczma, Jr. |
| 4,274,936 A | 6/1981 | Love |
| 4,401,522 A * | 8/1983 | Buschow et al. .............. 204/15 |
| 4,466,864 A | 8/1984 | Bacon et al. |
| 4,498,416 A | 2/1985 | Bouchaib |
| 4,500,407 A | 2/1985 | Boys et al. |
| 4,543,267 A | 9/1985 | Yamazaki |
| 4,678,545 A | 7/1987 | Galik |
| 4,749,465 A | 6/1988 | Flint et al. |
| 4,828,654 A * | 5/1989 | Reed ........................... 204/23 |
| 4,880,514 A | 11/1989 | Scott et al. |
| 4,891,115 A | 1/1990 | Shishkin et al. |
| 4,894,260 A | 1/1990 | Kumasaka et al. |
| 5,156,730 A | 10/1992 | Bhatt et al. |
| 5,326,455 A | 7/1994 | Kubo et al. |
| 5,421,987 A | 6/1995 | Tzanavaras et al. |
| 5,507,614 A | 4/1996 | Leonov et al. |
| 5,558,757 A | 9/1996 | Hubel |
| 5,651,868 A | 7/1997 | Canady et al. |
| 5,679,055 A | 10/1997 | Greene et al. |
| 5,703,372 A | 12/1997 | Horsky et al. |
| 5,776,327 A * | 7/1998 | Botts et al. .................... 205/96 |
| 5,814,196 A | 9/1998 | Hollars et al. |
| 5,933,902 A | 8/1999 | Frey |
| 5,935,330 A | 8/1999 | Taniguchi |
| 5,972,184 A | 10/1999 | Hollars et al. |
| 6,001,235 A | 12/1999 | Arken et al. |
| 6,033,540 A | 3/2000 | Kosaki et al. |
| 6,056,869 A | 5/2000 | Uzoh |
| 6,074,515 A | 6/2000 | Iseki et al. |
| 6,077,412 A | 6/2000 | Ting et al. |
| 6,083,357 A | 7/2000 | Begin et al. |
| 6,099,702 A | 8/2000 | Reid et al. |
| 6,251,756 B1 | 6/2001 | Horzel et al. |
| 6,368,040 B1 | 4/2002 | Yamasaki et al. |

* cited by examiner

*Primary Examiner*—Edna Wong
(74) *Attorney, Agent, or Firm*—Blakely Sokoloff Taylor & Zafman LLP

(57) ABSTRACT

A method of processing wafers or other articles within a processing cell, entailing transporting a carrier supporting a vertically-oriented wafer horizontally through an inlet opening of a process cell, processing the vertically-oriented wafer within the process cell, and then transporting the carrier out of the process cell horizontally through an outlet opening of the process cell. In one exemplary implementation, the process performed within the cell is a pre-or post- treatment where the wafer is subjected to an acid solution treatment and/or a rinsing with de-ionized water treatment. In another exemplary implementation, the process performed within the process cell is an electroplating of the plating surface of the wafer. Additionally, a method of processing an empty carrier entailing transporting the carrier horizontally through an inlet opening of a process cell, processing the carrier within the process cell, and transporting the carrier out of the process cell horizontally through an outlet opening.

17 Claims, 19 Drawing Sheets

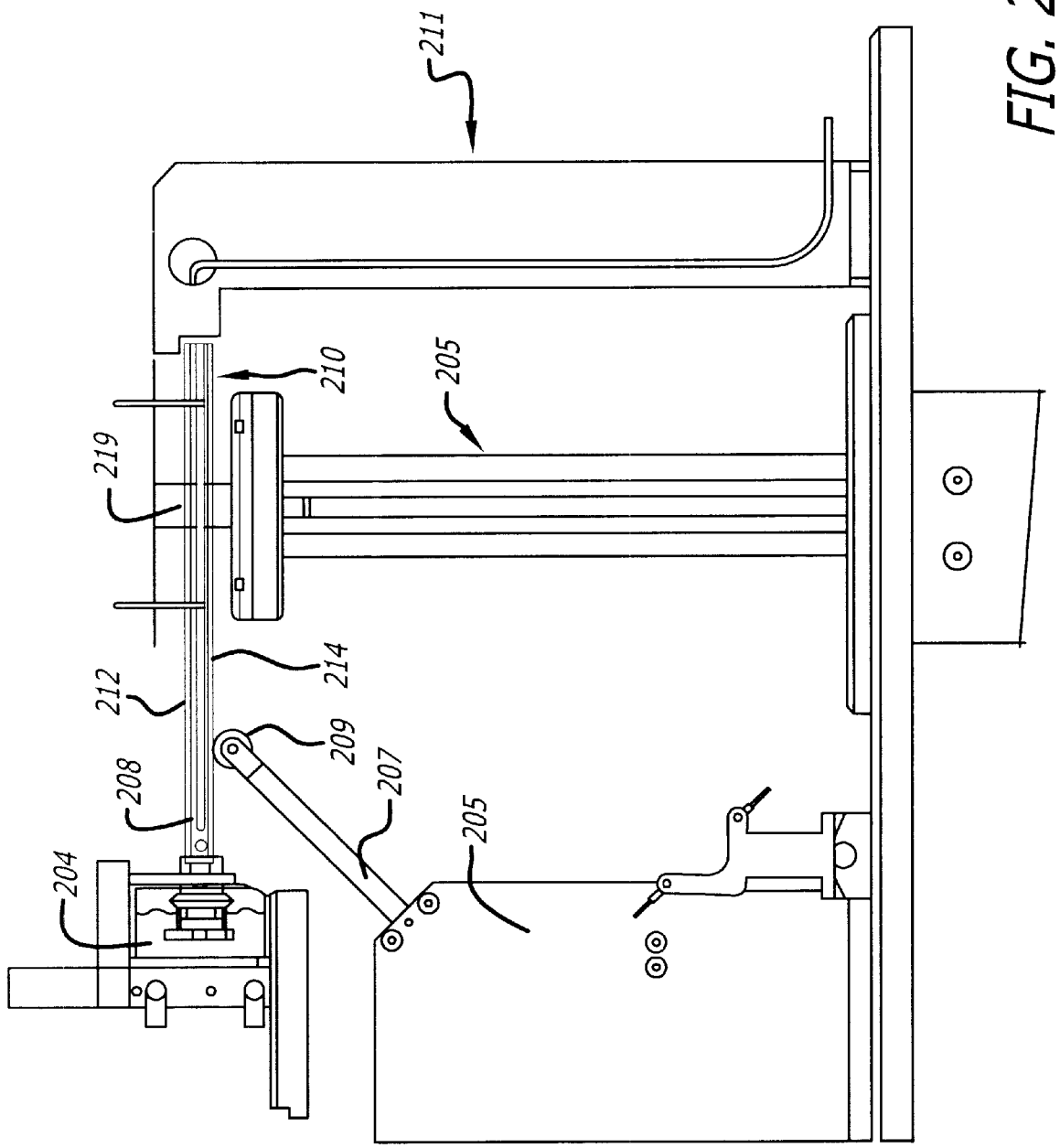

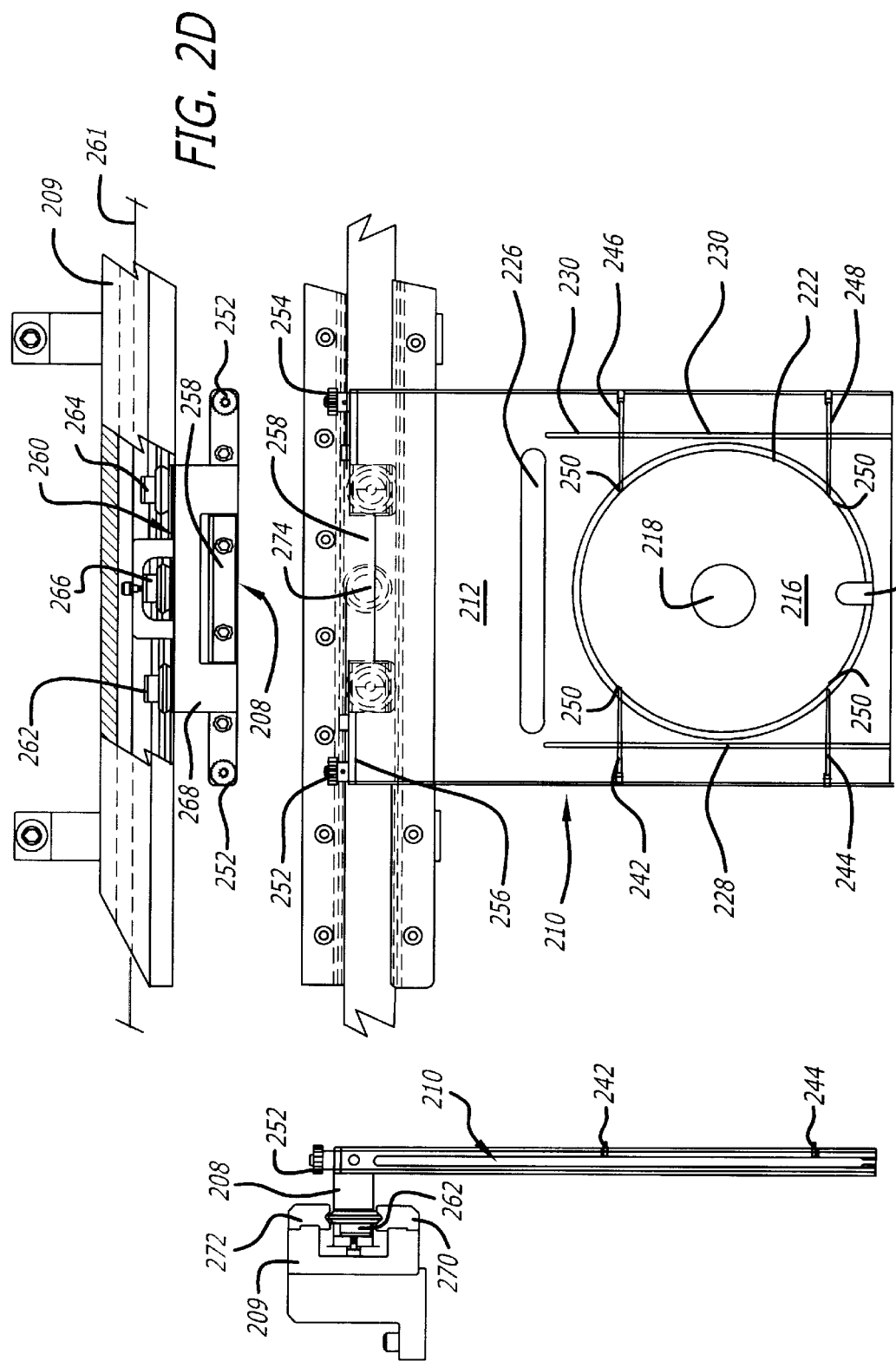

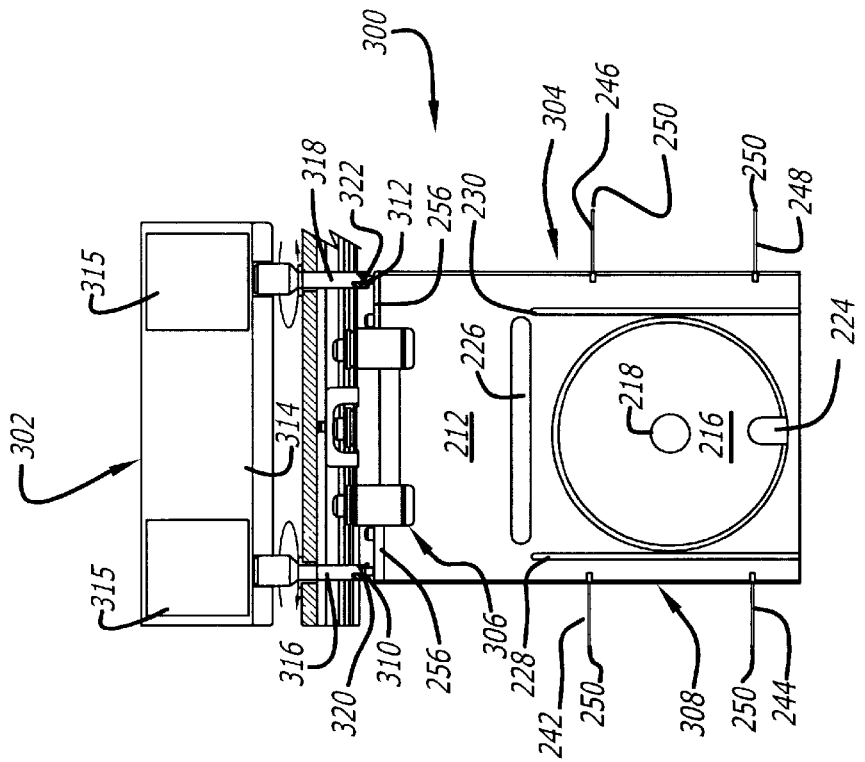
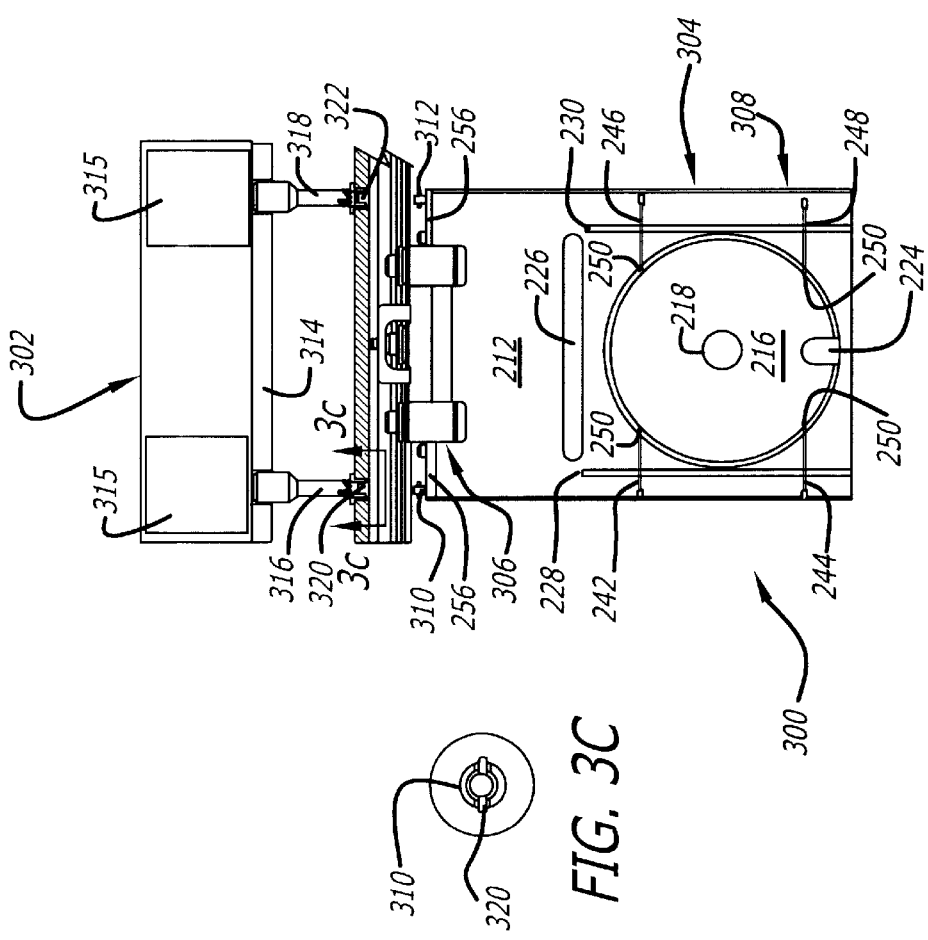
FIG. 3A
FIG. 3B
FIG. 3C

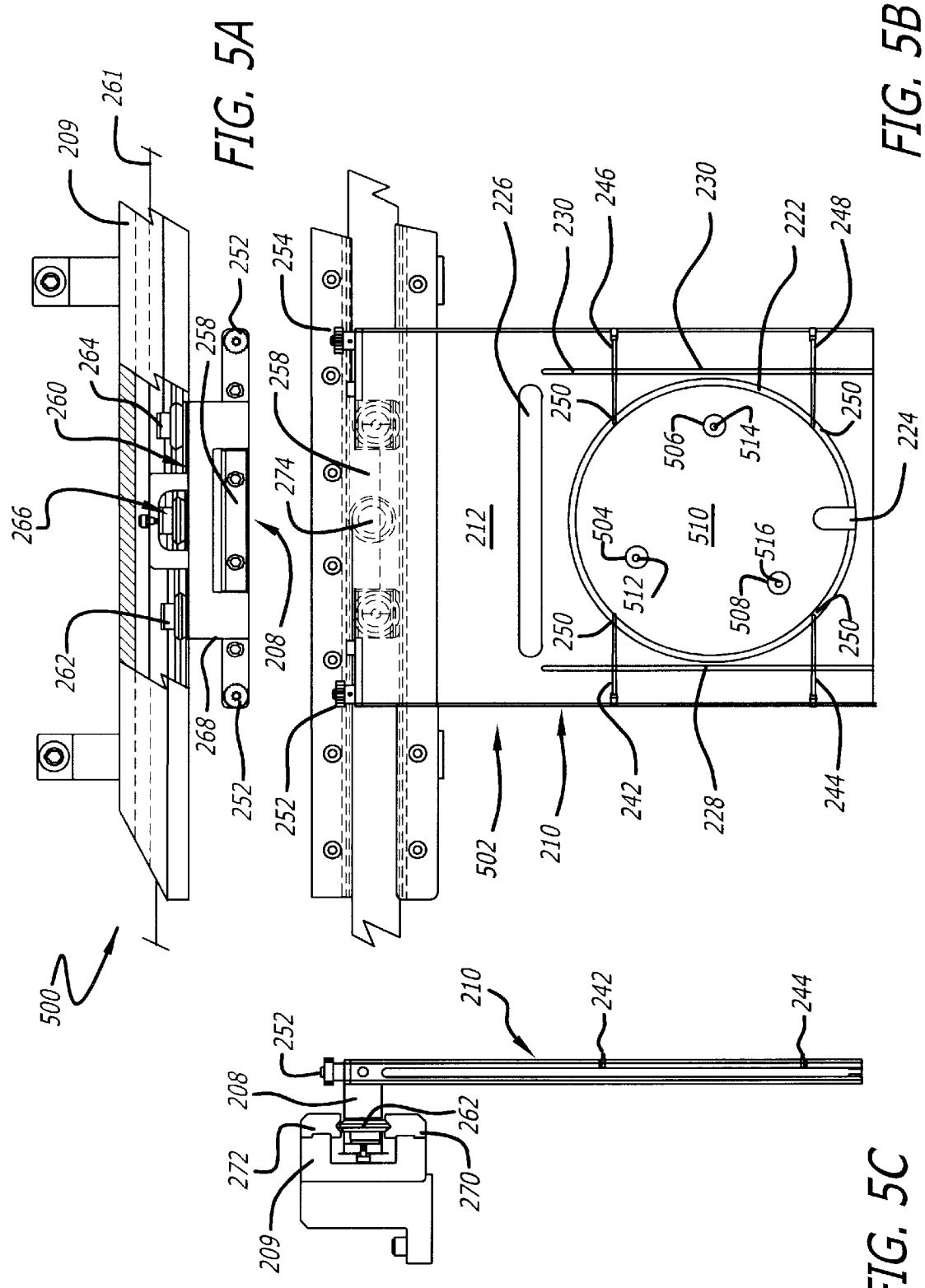

METHOD OF PROCESSING WAFERS AND OTHER PLANAR ARTICLES WITHIN A PROCESSING CELL

FIELD OF THE INVENTION

This invention relates generally to process and plating systems, and in particular, to an automatic multi-wafer process system that is characterized by horizontal transport of vertically-oriented wafers through one or more process cells and processing of vertically-oriented wafers within one or more process cells.

BACKGROUND OF THE INVENTION

Prior art automatic multi-wafer plating systems typically perform the plating of wafers in a horizontal manner. That is, the plating of a wafer occurs in a process where the wafer is oriented horizontally. In the typical case, a wafer is oriented horizontally with the plating surface facing downwards. Then, plating solution is directed upwards towards the plating surface of the wafer to form the plating deposition. In another case, a wafer is oriented horizontally with the plating surface facing upwards. Then, the wafer is immersed in a plating solution bath and fresh plating solution is directed down towards the plating surface of the wafer to form the plating deposition. In either case, if the plating process is electrolytic, a voltage potential is applied across the plating solution by an anode electrode exposed to the plating solution and a cathode electrode in contact with the plating surface of the wafer.

The automatic processing of multiple wafers using the horizontal processing of prior art plating systems typically involve a centralized robotic wafer loader surrounded by several process cells. This type of arrangement is referred to in the relevant art as a "cluster tool". In a cluster tool, a process cell may have more than one head in order to process multiple wafers simultaneously. In operation, the centralized robotic wafer loader loads a first set of wafers into a first process cells (e.g. cleaning and activation). When the first process is complete, the centralized robotic wafer loader transfers the first set of wafers angularly to the second process cell (e.g. electroplating) and then loads a second set of wafers into the first process cell. The centralized robotic wafer loader keeps loading and transferring wafers from process cell to process cell until the wafers have undergone all of the specified processes.

A drawback of the cluster tool arrangement stems from the fact that the centralized robotic wafer loader inserts and removes wafers from process cells many times during a run. Thus, the wafers are more susceptible to contamination and defects due to frequent handling by the centralized robotic wafer loader. Another drawback of the cluster tool arrangement stems from the fact that the process cells are arranged around the centralized robotic wafer loader. Often, there is a need to service the plating system as well as expel gases and/or liquids from process cells to maintain the integrity of the clean room environment. This is typically done through the rear of the process cells into a chase room by way of a clean room wall. Accordingly, in a cluster tool arrangement, it is more difficult to arrange the clean room wall and chase room to accommodate the circular arrangement of the process cells.

Thus, there is a need for a wafer processing system that can process wafers through one or more process cells without the need of frequently loading and unloading wafers into and from process cells. There is also a need for a wafer processing system that can interface relatively easy with a chase room for servicing and expulsion of unwanted gas and liquids. Such needs and others are met with the wafer processing system and related methods in accordance with the invention.

BRIEF DESCRIPTION OF THE DRAWINGS

FIG. 2B illustrates a side view of the exemplary wafer carrier being loaded with a wafer in accordance with the invention;

FIGS. 2D–2F illustrate top, front and side views of an exemplary belt-carrier coupling mechanism in accordance with the invention;

FIGS. 3A and 3B illustrate top views of a second exemplary wafer carrier in accordance with the invention;

FIG. 3C illustrate a cross-sectional view of a cross pin/slotted collar arrangement in accordance with invention;

FIGS. 5A–C illustrate front, top and side views of a fourth exemplary wafer carrier in accordance with the invention;

DETAILED DESCRIPTION OF THE INVENTION

I. Process Methodology

A. Overview

Figure 1A:
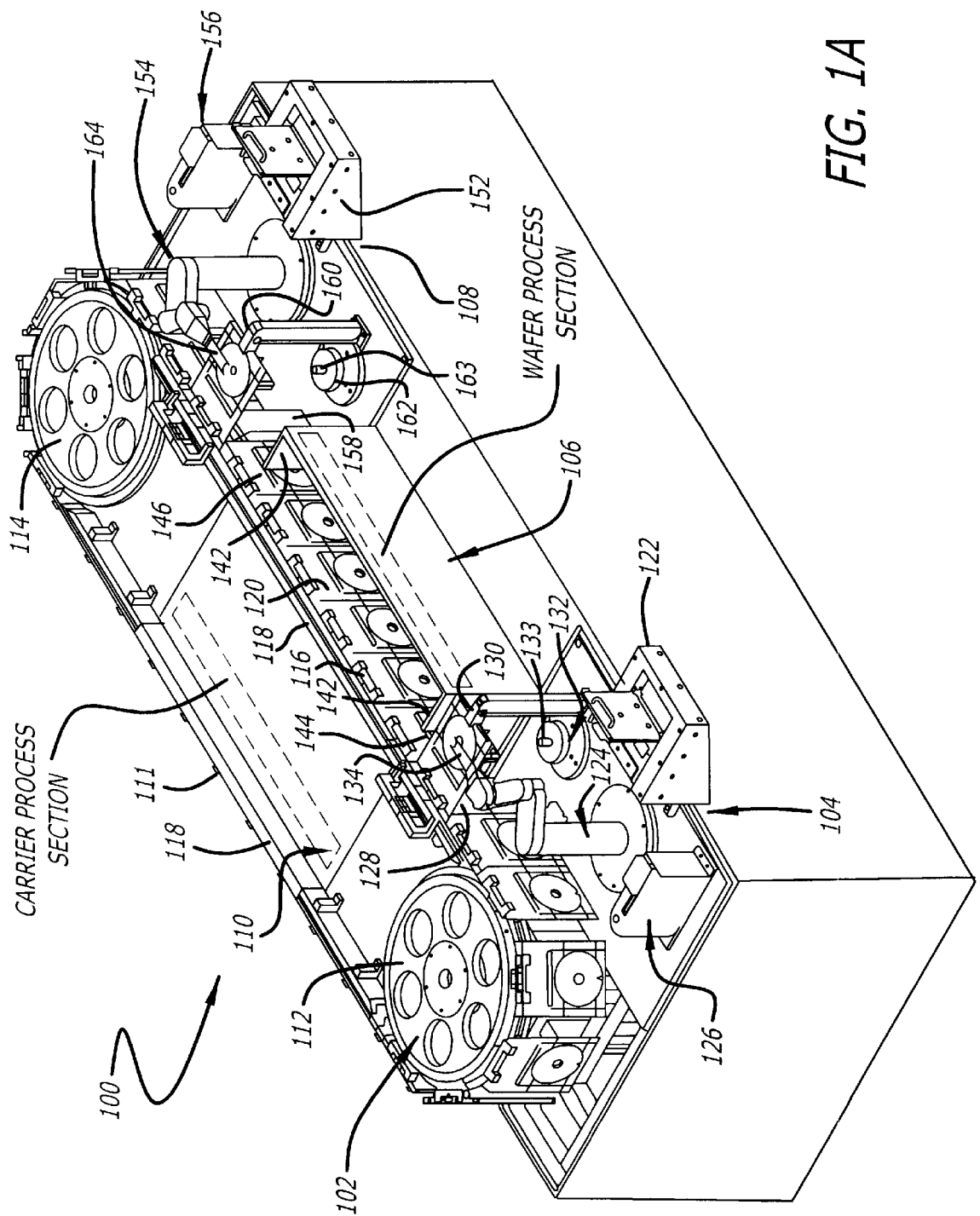
FIG. 1A illustrates a front perspective view of an exemplary wafer processing system in accordance with the invention.
Figure 1B:
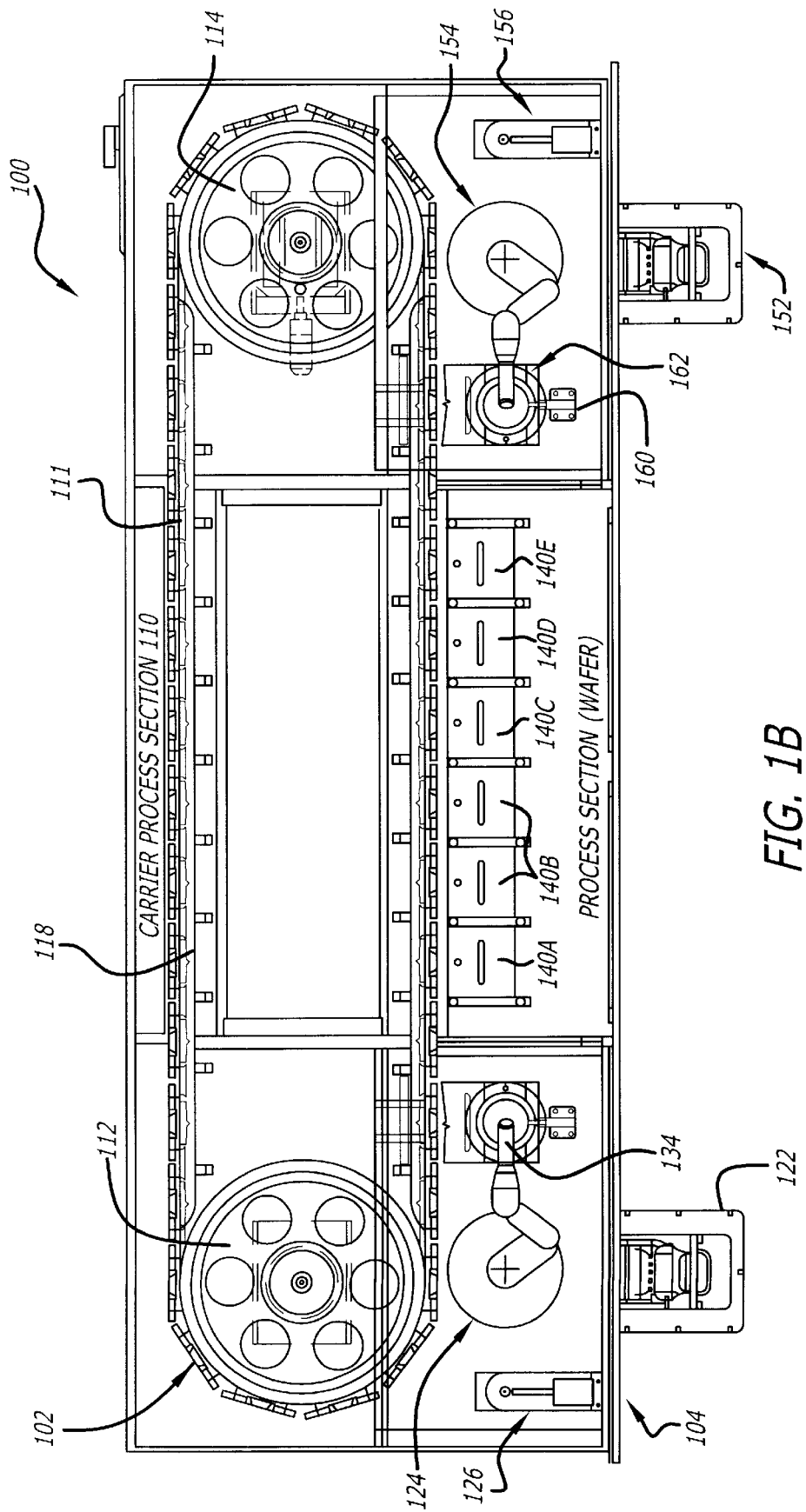
FIG. 1B illustrates a top view of the exemplary wafer processing system in accordance with the invention.
Figure 1C:
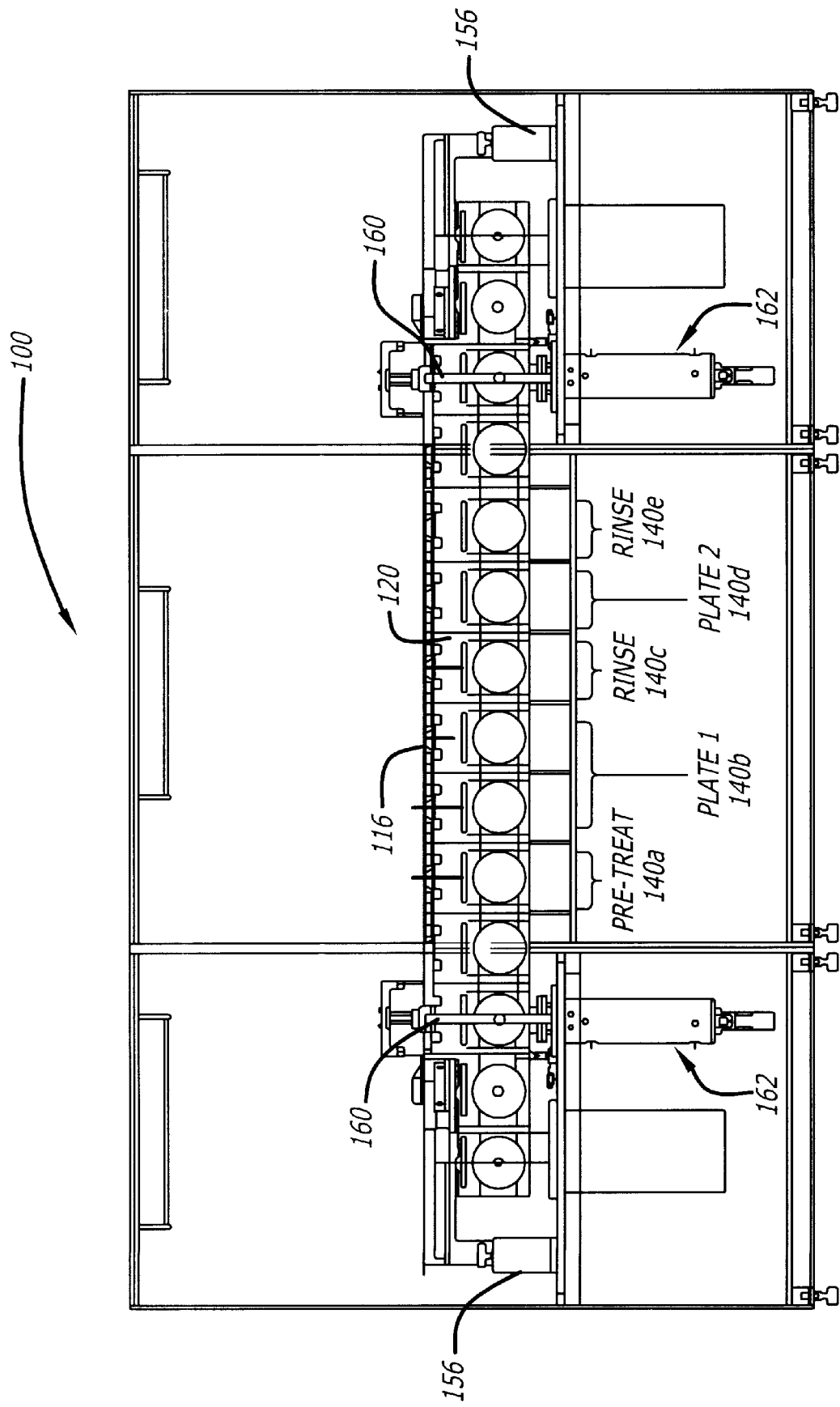
FIG. 1C illustrates a front view of the exemplary wafer processing system in accordance with the invention.
Figure 1D:
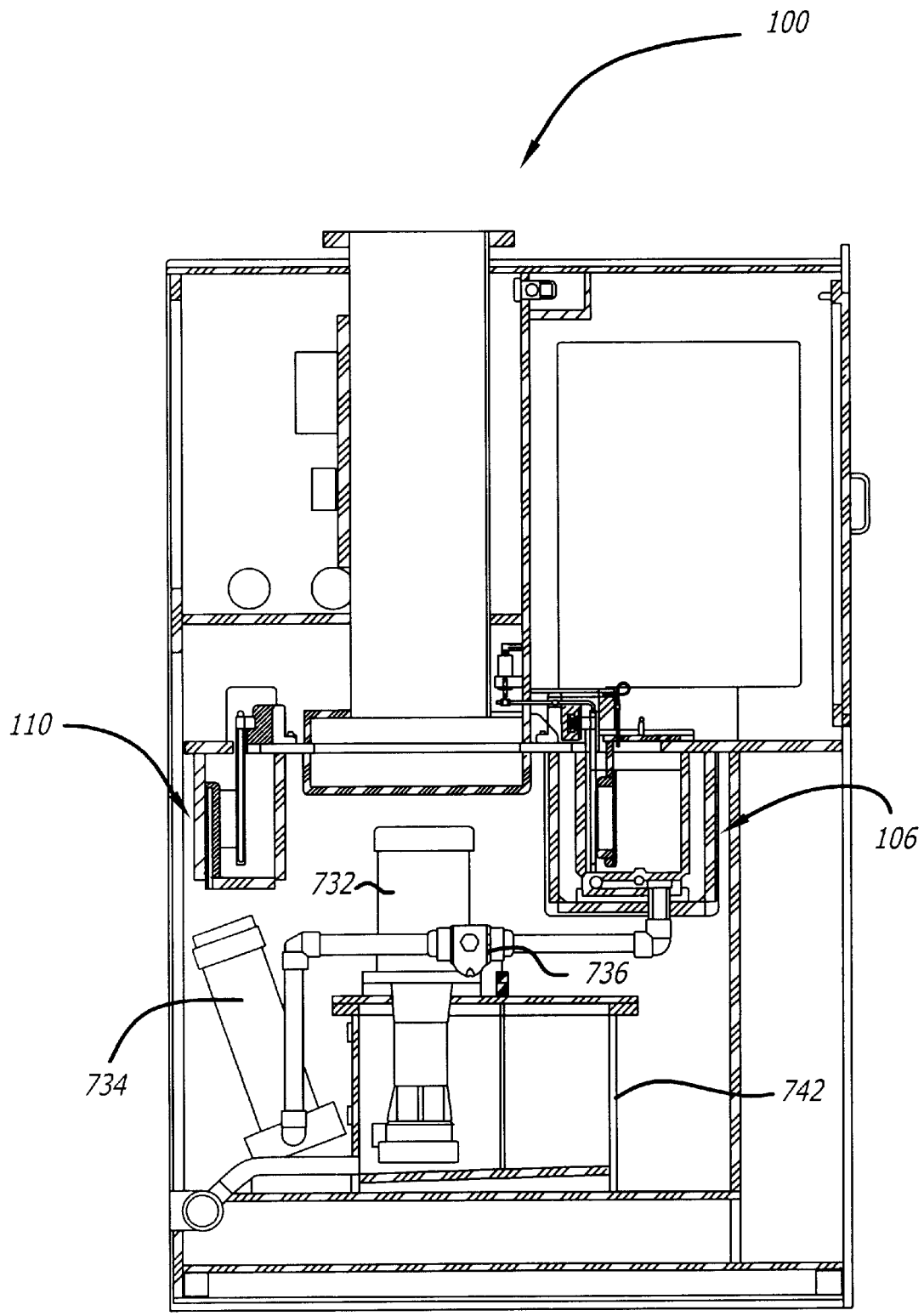
FIG. 1D illustrates a side view of the exemplary wafer processing system in accordance with the invention.

There are several aspects relating to the process methodology of the invention. A first aspect of the process methodology of the invention relates to the horizontal transportation of vertically-oriented wafers through one or more process cells. A second aspect of the process methodology of the invention relates to simultaneously and serially processing of a plurality of vertically-oriented wafers at respective process cells which are spaced apart from each other by an indexing distance or a multiple thereof. A third aspect of the process methodology of the invention relates to the loading of a wafer onto a carrier in a horizontal fashion, rotating the carrier approximately 90 degrees to orient the wafer in a vertical fashion for processing, and then moving the carrier horizontally to one or more process cells for processing of the vertically-oriented wafer.

B. Horizontal Transport of Vertically-Oriented Wafers

The first aspect of the process methodology of the invention relates to the horizontal transportation of vertically-oriented wafers through one or more process cells. According to this process methodology, a wafer is supported by a carrier in a manner that the wafer is oriented substantially vertical. That is, the wafer plating side is substantially parallel to the vertical axis. The wafer carrier is then transported in a substantially horizontal direction serially into one or more process cells by way of side openings through the walls of respective one or more process cells. Within a process cell, the wafer undergoes a process while being oriented substantially vertical. The particular process performed on the vertically-oriented wafer can vary substantially. As an example, the vertically-oriented wafer may be subjected to a pretreatment process, or the vertically-oriented wafer may be subjected to an electroplating or electroless plating process, or the vertically-oriented wafer may be subjected to a post-treatment process.

Using this process methodology, a multiple stage process can be performed on a vertically-oriented wafer. In this case, a plurality of process cells are oriented serially along the direction of the carrier transport. For example, the first process cell in the series may be a pre-treatment cell where the vertically-oriented wafer is subjected to a cleaning and activating process, the second process cell in the series may be an electroplating process cell where the vertically-oriented cell is subjected to an electroplating of its plating surface, and the third process cell in the series may be a post-treatment process cell where the vertically-oriented wafer is subjected to rinsing and drying.

In operation, the wafer is loaded onto a carrier at a loading station. Once the wafer is loaded onto the carrier and is in a substantially vertical orientation, the carrier is then transported horizontally into the first process cell by way of an inlet opening through a side wall of the first process cell. The vertically-oriented wafer then undergoes the pre-treatment process. Once the pre-treatment process is complete, the carrier is once again transported horizontally into the second process cell by way of an outlet opening through a side wall of the first process cell and an inlet opening through a side wall of the second process cell. The vertically-oriented wafer then undergoes the plating process.

Once the plating process is complete, the carrier is once again transported horizontally into the third process cell by way of an outlet opening through a side wall of the second process cell and an inlet opening through a side wall of the third process cell. The vertically-oriented wafer then undergoes the post-treatment process. Once the post-treatment process is complete, the carrier is once again transported horizontally into the unloading station by way of an outlet opening through a side wall of the third process cell. The wafer is then removed from the carrier. The above is merely an example of a multiple stage process that can be performed using the horizontal transport and vertical processing of wafers in accordance with the process methodology of the invention.

C. Simultaneous and Serial Processing at Indexed Process Cells

The second aspect of the process methodology of the invention relates to simultaneously and serially processing of a plurality of vertically-oriented wafers at respective process cells which are spaced apart from each other by an indexing distance or a multiple thereof. According to this process methodology, a plurality of process cells are serially oriented between a loading station and an unloading station. The spacing between adjacent process cells is an index distance or a multiple thereof. The vertically-oriented wafers are then serially indexed into the respective process cells for simultaneously processing of the wafers. As discussed below, an example multiple stage plating process will serve to illustrate this aspect of the process methodology of the invention.

In operation, a first wafer is loaded onto a first carrier at a loading station. Once the first wafer is loaded onto the first carrier and is in a substantially vertical orientation, the first carrier is then indexed horizontally into the first process cell for pre-treatment process. Simultaneously with the first wafer undergoing the pre-treatment process at the first process cell, a second wafer is loaded onto a second carrier at the loading station. After the completion of the pre-treatment process on the first wafer and the loading of the second wafer onto the second carrier, both the first and second carriers are indexed horizontally respectively into the second and first process cells so that the first wafer undergoes the plating process and the second wafer undergoes the pre-treatment process.

Simultaneously with the first wafer undergoing the plating process at the second process cell and the second wafer undergoing the pre-treatment process at the first process cell, a third wafer is loaded onto a third carrier at the loading station. After the completion of the plating process on the first wafer, the pre-treatment process on the second wafer, and the loading of the third wafer onto the third carrier, the first, second and third carriers are indexed horizontally into respectively the third, second and first process cells so that the first wafer undergoes the post-treatment process at the third process cell, the second wafer undergoes the plating process at the second process cell, and the third wafer undergoes the pre-treatment process at the first process cell.

Simultaneously with the first wafer undergoing the post-treatment process at the third process cell, the second wafer undergoing the plating process at the second process cell, the third wafer undergoing the pre-treatment process at the first process cell, a fourth wafer is loaded onto a fourth carrier at the loading station. After the completion of the post-treatment process on the first wafer, the plating process on the second wafer, the pre-treatment process on the third wafer, and the loading of the fourth wafer onto the fourth carrier, the first, second, third and fourth carriers are indexed horizontally into respectively the unloading station and the third, second and first process cells so that the first wafer is unloaded from the first carrier, the second wafer undergoes the post-treatment process at the third process cell, the third wafer undergoes the plating process at the second process cell, and the fourth wafer undergoes the pre-treatment process at the first process cell.

These steps of simultaneous loading, processing, and unloading of wafers continues until all of the wafers have undergone the specified processes and are unloaded at the unloading station. It should be noted that the length of a process cell need not be restricted to one index distance. A process cell may have a length of two or more index distances. A process cell having multiple index positions can be used to "average" inherent defects on the wafers due to imperfections in the process equipment.

D. Horizontal Loading and Vertical Processing of Wafers

The third aspect of the process methodology of the invention relates to the loading of a wafer onto a carrier in a horizontal fashion, rotating the carrier approximately 90 degrees to orient the wafer in a vertical fashion for processing, and then moving the carrier horizontally to one or more process cells for processing of the vertically-oriented wafer. As discussed in the Background of the Invention, prior art automatic multi-wafer plating systems use horizontal loading of wafers into process cells for processing the horizontally-oriented wafers. Accordingly, wafer loading equipment readily available load wafers into process cell in a horizontal fashion.

Thus, in order for the vertical processing methodology of the invention to make use of existing wafer loading equipment, a wafer loading equipment may load a wafer onto a carrier in a horizontal fashion, and then the loaded carrier is rotated 90 degrees to orient the wafer vertically for processing. Conversely, during the unloading of the wafer, a wafer is rotated 90 degrees to change the orientation of the wafer from vertical to horizontal so that a wafer loading equipment may remove the wafer from the carrier in a horizontal fashion. Thus, allowing the vertical plating methodology of the invention to be compatible with horizontal wafer loading equipment.

E. Conclusion on the Process Methodology

The various process methodology discussed above can be implemented in many ways in processing equipment. The following describes an exemplary wafer processing system that implements the process methodology of the invention.

II. Wafer Processing System

A. Overview

FIGS. 1A–D illustrate front perspective, top, front and side views of an exemplary wafer processing system 100 in accordance with the invention. The exemplary wafer processing system 100 comprises five major components: a carrier transport system 102, a wafer loading station 104, a wafer process section 106, a wafer unloading station 108, and a carrier process section 110. The carrier transport system 102 is the component of the wafer processing system 100 that provides the horizontal transportation (or indexing) of the carriers supporting the vertically-oriented wafers in accordance with the process methodology. The wafer loading station 104 is the component of the wafer processing system 100 that loads wafers onto carriers in a horizontal fashion according to the process methodology. The wafer process section 106 is the component of the wafer processing system 100 where the wafer undergoes vertical processing according to the process methodology. The wafer unloading station 108 is the component of the wafer processing system 100 that unloads wafers from carriers in a horizontal fashion according to the process methodology. And, the carrier process section 110 is the component of the wafer processing system 100 that performs specified processing on empty carriers.

B. Carrier Transport System

As discussed, the carrier transport system 102 provides the horizontal transportation (or indexing) of the carriers supporting the vertically-oriented wafers in accordance with the invention. The carrier transport system 102 comprises a belt 111 coupled to a drive wheel 112 (driven by a servo motor) and an idler wheel 114 for rotation of the belt 111 around both wheels 112 and 114, A plurality of belt-to-carrier couplings 116 for supporting carriers are mechanically coupled to the belt 111 at respective regions which are spaced apart by approximately the index distance. The belt-to-carrier couplings 116 support the respective carriers 120 in a manner that allow them to pivot from a vertical orientation to a horizontal orientation. The carrier transport system 102 further comprises a track 118 to guide the horizontal movement of the belt-to-carrier couplings 116 along the wafer process section 106 and the carrier process section 110.

When horizontal movement of the carriers is desired, the servo motor is actuated to drive the drive wheel 112, which drives the belt 111, the carrier-coupling 116, and the carriers 120. Typically, the movement of the carriers 120 will be the index distance or a multiple thereof. The index distance can be the distance from a one-carrier-length process cell to an adjacent one-carrier-length process cell. However, the movement of the carriers 120 need not be limited to the index distance. An exemplary index distance may be approximately eight (8) inches to move a carrier from a process cell to an adjacent process cell, As will be explained in more detail later, the carriers 120 are initially moved a majority portion of the index distance (e.g. 7.9 inches), and then the remaining movement will be governed by a sensor which senses when a carrier is precisely at the loading station. In other words, when the carrier 120 accurately reaches the loading station, the sensor will signal the controller for the carrier transport system 102 to stop actuating the servo motor.

C. Wafer Loading Station

As discussed, the wafer loading station 104 loads wafers onto carriers 120 in a horizontal fashion in accordance with the invention. The wafer loading station 104 may comprise a cassette load station 122, a robotic wafer loading equipment 124, a wafer pre-aligner 126, a carrier rotator 128, a carrier stop 130, and a wafer lifter 132. The cassette load station 122 supports a cassette having separate slots for respectively holding a plurality of wafers to be processed. When a cassette (not shown) is initially loaded on the cassette load station 122, the slots and consequently the wafers are oriented in a vertical fashion. The cassette load station 122 is then operated to rotate the cassette 90 degrees to orient the slots and consequently the wafers in a horizontal fashion.

Once the cassette load station 122 has rotated the cassette, the carrier transport system 102 moves the carriers 120 to accurately place an empty carrier at the loading station as discussed above. When the empty carrier 120 is precisely at the loading station, the carrier rotator 128 is actuated to rotate the empty carrier 120 counter-clockwise to a horizontal orientation. The carrier stop 130 is positioned to stop the rotation of the empty carrier 120 when it is substantially horizontally oriented.

Once the empty carrier 120 is precisely at the loading station and is substantially horizontally oriented, the robotic wafer loading equipment 124 is actuated to move its pick-up head 134 to the cassette load station 122 to pick up a wafer. The pick-up head 134 applies a vacuum to the wafer in order to pick up the wafer. Then, the robotic wafer loading equipment 124 is actuated to move its pick-up head 134 to place the wafer on the wafer pre-aligner 126. The wafer pre-aligner 126 moves the wafer to accurately align the wafer at a pre-determined position with respect the pick-up head 134. Then, the robotic wafer loading equipment 124 is actuated to have its pick-up head 134 pick up the wafer from the wafer pre-aligner 126 and to place the wafer above a pre-determined position over the empty carrier 120.

After the pick-up head 134 is holding the wafer at the predetermined position above the carrier in a substantially horizontal orientation, the wafer lifter 132 is actuated to move its vacuum post 133 vertically upwards through an opening of the empty carrier 120 until it contacts the underside of the wafer. Then, the vacuum on the pick-up head 134 is removed and a vacuum is applied to the vacuum post 133 to transfer the wafer from the pick-up head 134 to the post 133. Once this is complete, the wafer lifter 132 is actuated to lower its post 133 and place the wafer at a pre-determined position on the carrier 120. After the wafer is placed on the carrier 120, mechanical supports on the carrier are actuated to securely support the wafer on the carrier 120. Then the carrier rotator 128 is actuated to rotate the loaded carrier 90 degrees clockwise to place the wafer substantially in a vertical orientation.

Thus, the wafer loading station 104 loads wafers on carriers 120 in a horizontal fashion, and then rotates the carriers 120 to orient the wafers in a vertical fashion according to the process methodology of the invention.

D. Wafer Process Section

As discussed, the wafer process section 106 is where the wafers undergo the one or more specified processes for the wafers. The wafer process section 106 may comprise one or more process cells 140a–e. Each of the process cells 140a–e comprises one or more walls 142 to partially enclose the process area. In addition, each of the process cells 140a–e further includes an inlet opening 144 at one of its walls to pass through a horizontally-transported carrier into the respective process cells 140a–e. Also, each of the process cells 140a–e comprises an outlet opening 146 at one of its walls to pass through a horizontal-transported carrier exiting the respective process cells 140. Adjacent process cells 140a–e may have common walls. If such is the case, the outlet opening 146 of one process cell may also serve as the inlet opening 144 of the adjacent process cell. The length of a process cell along the direction of the carrier movement may be substantially one index distance or a multiple thereof.

The particular processes performed within the one or more process cells 140a–e can be varied substantially, depending on the process specification for the wafers. As an example, the wafer processing system 100 can be set to provide a plating deposition on the plating surface of the wafers. The plating deposition may comprise one or more distinct plating materials. For instance, as shown the wafer process section 106 may comprise a first process cell 140a for pre-treatment process of wafers such as cleaning and activating, a second process cell 140b for plating the wafers with a first plating material, a third process cell 140c for rinsing the wafers, a fourth process cell 140d for plating the wafers with a second plating material, and a fifth process cell 140e for post-treatment rinsing of the wafers. In this example, all of the process cells have a length in the direction of the carrier movement of one index distance, except the second process cell 140b which has a length of two index lengths.

In operation, after a wafer has been loaded onto a carrier at the loading station 104 and the carrier 120 has been rotated to orient the wafer in a vertical orientation, the carrier transport system 102 is actuated to index the loaded carrier 120 into the first process cell 140a so that the vertically-oriented wafer undergoes the pretreatment process. In the exemplary wafer processing system 100, the loaded carrier 120 has to be transported horizontally two index lengths since the first process cell is two index lengths from the loading station. After the completion of the pre-treatment process on the wafer, the carrier transport system 102 is actuated again to index the carrier to the second process cell 140b where the wafer undergoes a first plating process to form a plating deposition of a first material.

In this example, the length of the second process cell 140b is two index distances. Thus, the carrier transport system 102 has to index the carrier 120 twice before the first plating process is complete. Accordingly, a first portion of the plating of the wafer occurs in the first index position within the process cell 140b and the remaining portion of the plating of the wafer occurs in the second index position within the process cell 140b. An advantage of having multiple index positions within a process cell is the averaging of defects on the wafers caused by imperfections in the process equipment.

After the wafer has completed the first plating process at the second process cell 140b, the carrier transport system 102 is actuated to index the carrier 120 to the third process cell 140c to perform a rinsing and drying on the wafer. Once this is complete, the carrier transport system 102 is actuated to index the carrier 120 to the fourth process cell 140d to perform another plating process to plate the wafer with a second plating material, and then the carrier transport system 102 is actuated again to index the carrier 120 to the fifth process cell 140e to perform a post-treatment rinsing and drying process on the wafer. In this example, the drying step completes the specified process for the wafer. The carrier transport system 102 is actuated once more to index the carrier 120 to the unloading station 108 to unload the wafer from the carrier 120.

The above example illustrates the process cycle for a single wafer. Generally, the wafer processing system 100 of the invention will be used for processing multiple wafers simultaneously. In this regard, when the carrier transport system 102 indexes the carriers 120, a new wafer is loaded onto a carrier 120. Thus, at a particular time, there may be a wafer at the wafer loading station 104 being loaded onto a carrier 102, another wafer in the first process cell 140a undergoing a pre-treatment process, another two wafers at the second process cell 140b undergoing the first plating process, another wafer at the third process cell 140c undergoing the rinsing process, another wafer at the fourth process cell 140d undergoing the second plating process, another wafer at the fifth process cell 140e undergoing the post-treatment rinsing and drying process, and another wafer at the wafer unloading station 108 being unloaded from the wafer and placed at the cassette.

E. Wafer Unloading Station

As discussed, the wafer unloading station 108 unloads wafers from carriers 120 in a horizontal fashion in accordance with the invention. The unloading of the wafers from carriers 120 is similar to the loading of the wafers onto carriers 120 as discussed above in section IIC, except in the reverse direction. The wafer unloading station 108 comprises a cassette unload station 152, a robotic wafer unloading equipment 154, a wafer pre-aligner 156, a carrier rotator 158, a carrier stop 160, and a wafer lifter 162.

In operation, when a loaded carrier 120 is indexed to the wafer unloading station 108, the carrier rotator 158 rotates the carrier 120 from its vertical orientation until it makes contact with the carrier stop 160 where the carrier 120 is substantially horizontal. Then, the mechanism on the carrier 120 that securely supports the wafer on the carrier 120 is actuated to release the wafer. After this occurs, the wafer lifter 162 is actuated to lift its vacuum support until it makes contact with the underside of the wafer through an opening in the carrier 120. When the wafer lifter 162 makes contact with the wafer, a vacuum is formed on the vacuum support to hold the wafer firmly on the post 163. Then the wafer lifter 162 is actuated again to lift the wafer a pre-determined distance above the carrier 120.

Once the wafer is firmly held by the wafer lifter 162 a pre-determined distance above the carrier 120, the robotic wafer unloading equipment 154 is actuated to move its pick-up head 164 over the wafer and then make contact with the top side of the wafer. Then, the robotic wafer unloading equipment 154 applies a vacuum suction on its pick-up head 164 to secure the wafer on the pick-up head 164. At the same time, or slightly after, the vacuum suction on the wafer lifter 162 is removed so that the support of the wafer is transferred from the wafer lifter 162 to the robotic wafer unloading equipment 154. The wafer lifter 162 is subsequently actuated to lower its wafer post below the carrier 120, and then the carrier rotator 158 is actuated again to rotate the carrier 120 from its horizontal orientation to its vertical orientation.

After the wafer is firmly held by the pick-up head 164, the robotic wafer unloading equipment 154 is actuated to move its pick-up head 164 over the wafer aligner 156 and place the wafer on the wafer aligner 156. The wafer pre-aligner 156 moves the wafer to accurately align the wafer with respect to the pick-up head 164 at a pre-determined position. Then, the robotic wafer unloading equipment 154 is actuated to have its pick-up head 164 pick up the wafer from the wafer pre-aligner 156 and to place the wafer within a horizontally-oriented slot of the cassette. This process is repeated until all the desired wafers are processed and placed within respective slots of the cassette or until each slot of the cassette occupies a processed wafer. When this occurs, the an operator rotates the cassette substantially 90 degrees to orient the slots and consequently the wafers in a vertical orientation to facilitate safe handling of the cassette and wafers.

F. Carrier Process Section

As discussed, the carrier process section 110 performs specified processing on the carriers in accordance with the invention. After a carrier 120 has been through a plating process, it may need subsequent treatment to prepare it for the next process run. For example, if the carrier 120 has one or more cathode contacts, often undesired plating deposition may result on the one or more cathode contacts. Thus, it would be desirable to strip this plating deposition off the one or more cathode contacts of the carrier 120. Other post-process treatments can also be performed on the carrier 120 and its various components.

In this regard, the wafer process system 100 includes a carrier process section 110 along the carrier transport route, and in this example, at the rear side of the wafer process system 100. Thus, after a carrier 120 has taken a wafer through the specified processes performed in the wafer process section 106 and it is situated vertically at the wafer unloading station 108, the carrier 120 is subsequently indexed several times until it reaches the carrier process section 110. The carrier process section 110 may comprise one or more process cells to perform respective one or more desired processes on the carrier 120. Once a carrier 120 has undergone the specified one or more processes performed in the carrier process section 110, the carrier 120 is indexed again several times to reach the wafer loading station 104 to transport another wafer through the wafer process section 106.

G. Conclusion on the Wafer Processing System

As discussed, the wafer processing system 100 is a particular embodiment that implements the process methodology of the invention. The carrier transport system 102 provides the horizontal transport of vertically-oriented wafers in accordance with the process methodology of the invention. The wafer loading station 104 located at a particular indexed position, the wafer processing section 104 having one or more process cells also located at one or more other indexed positions, the wafer unloading station 108 at yet another indexed position allows for simultaneous and serial processing of wafers at various indexed positions in accordance with the process methodology of the invention. Furthermore, the wafer loading and unloading stations 104 and 108 including their respective components and the pivotal coupling of the carrier 120 to the carrier transport system 102 allows for horizontal loading and vertical processing of wafers in accordance with the process methodology of the invention.

The following describes more detailed embodiments of the various elements of the wafer processing system 100 of the invention.

III. Rack Assembly and Drive Mechanism

Figure 2A:
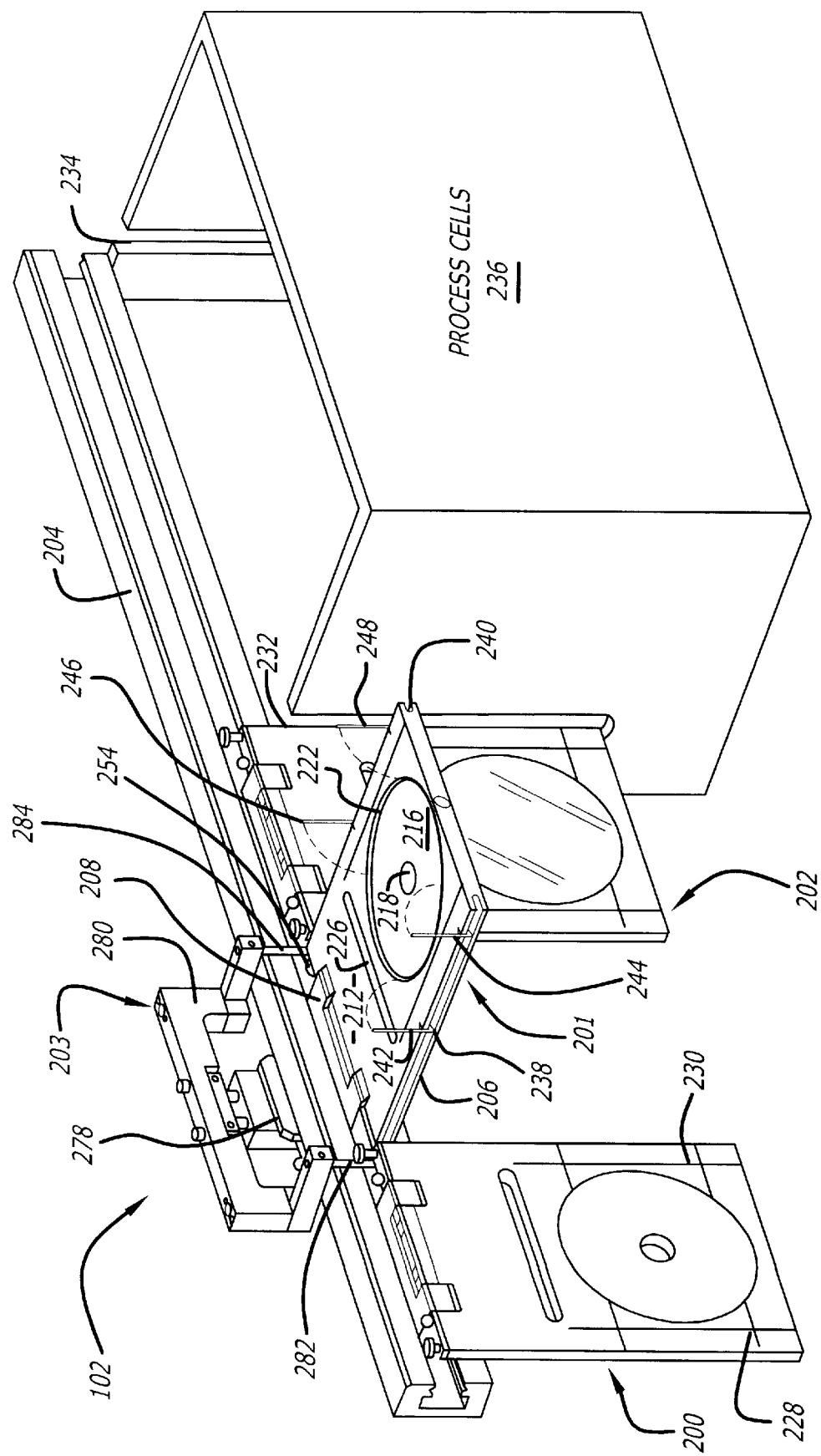
FIG. 2A illustrates a front perspective view of an exemplary wafer carrier without a loaded wafer in accordance with the invention.
Figure 2C:
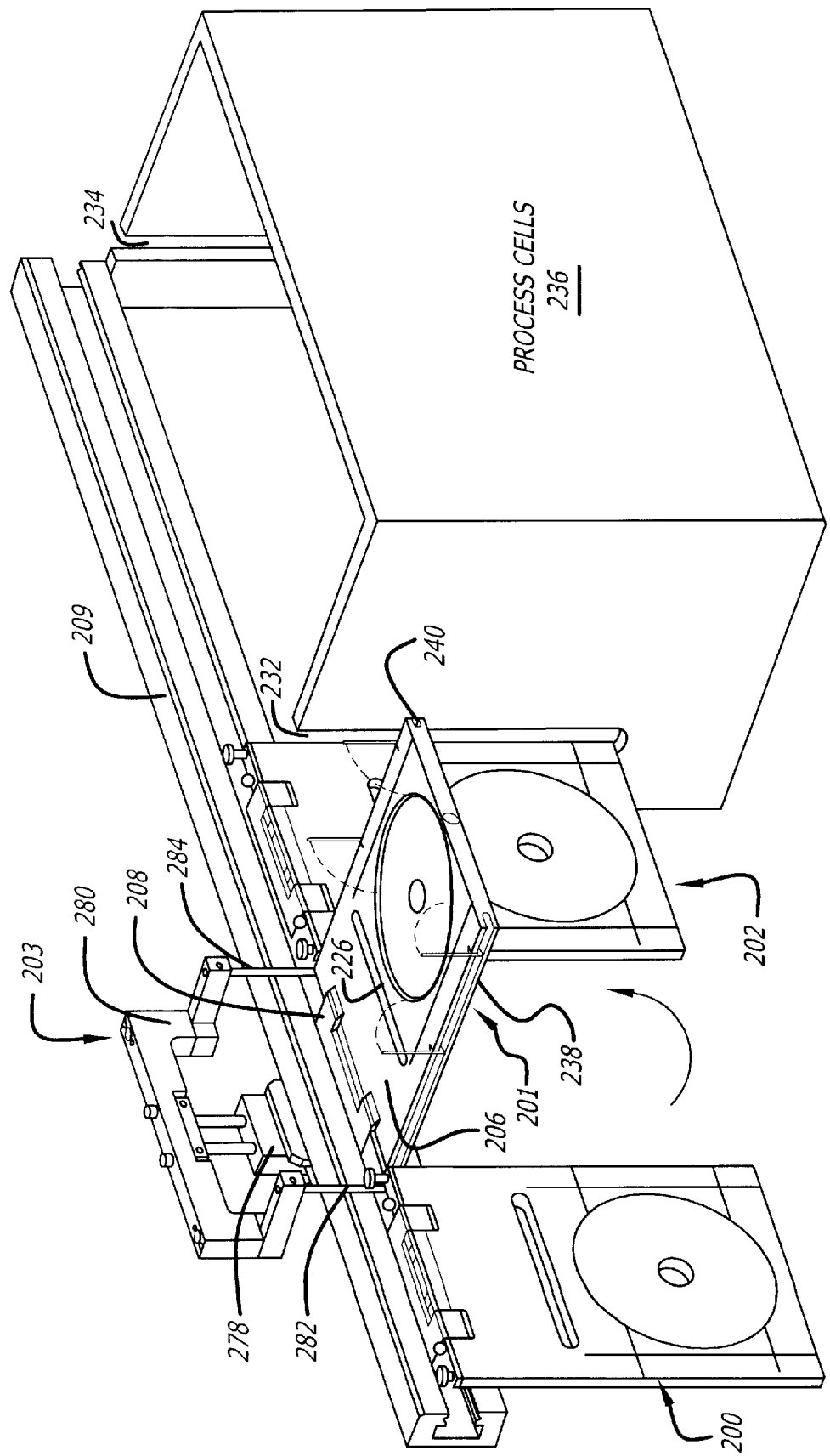
FIG. 2C illustrates a front perspective view of an exemplary wafer carrier with a loaded wafer in accordance with the invention.

FIGS. 2A–2D illustrate an exemplary transport carrier system 102 having racks 200, 201, 202 and a contact open/close mechanism 203 in accordance with the present invention. Generally, the wafer processing system 100 is configured to plate a cassette of identical substrates. As such, the racks 200, 201, 202 are similarly identical. However, it is noted that some or all of the racks may be configured differently to accommodate particular processing needs. As shown in FIGS. 2A and 2C, the racks 200, 201, 202 travel along a track 204 from left to right, wherein the first rack 200 is in the vertical orientation, the second rack 201 is in the horizontal orientation, and the third rack 202 is in the vertical orientation. Since the racks 200, 201, 202 are identical in the exemplary wafer processing system 100, only the second rack 201 will be described hereinafter.

The rack 201 is rotated from the vertical orientation to the horizontal orientation and from the horizontal orientation to the vertical orientation by a carrier rotor 205. The carrier rotor 205 has an extendable and retractable leg 207 and a roller 209. The leg 207 is in the retracted position when the rack 201 is oriented vertically. As the leg 207 extends outwardly, the roller 209 contacts the back face of the rack 201 and pushes the rack 201 upwards such that the rack 201 pivots to the horizontal orientation. Rotation beyond the horizontal orientation is limited by a carrier stop 211. The rack 201 may then be rotated to the vertical orientation by retracting the leg 207.

The rack 201 includes a carrier 206, a belt-to-carrier coupling 208, and a cathode assembly 210. The carrier 206 acts as a platform on which the wafer is attached, and the cathode assembly 210 serves the dual purpose of securing the wafer onto the carrier 206 and electrically coupling the wafer to the cathode power supply. Horizontal transport of the rack 202 is provided by coupling the drive belt to the carrier 206 via the belt-to-carrier coupling 208.

The carrier 206 may be a rectangularly shaped plate formed from an electrically insulative material such as polycarbonate or others. The carrier 206 has a front surface 212 and a back surface 214. In the particular embodiment shown in FIGS. 2A–2F, the carrier 206 has a length of about ten and a half (10.5) inches in length, a width of about eight (8) inches, and a thickness of about a half (0.5) inch. Of course, the carrier 206 may be dimensioned larger to accommodate larger sized substrates or dimensioned smaller when desirable. The carrier 206 includes a circular recess (mount) 216 with an outer diameter slightly larger than the wafer, and an opening 218 is located at the recess 216 to allow a post 219 of the wafer lifter 205 to pass through the carrier 206. In this particular embodiment, the circular recess 216 has an outer diameter of approximately one hundred and fifty (150) mm. The recess may be shaped in a non circular fashion to accommodate non wafer type substrates. For example, the recess may be rectangularly shaped to plate alumina substrates used for hybrid circuits. A contact ridge 222 is located at an outer portion of the circular recess 216 to support the wafer and to prevent the backside of the wafer from contacting the carrier 206 so as to minimize damage and contamination of the backside. A chamber (not shown) is formed between the backside of the wafer and the circular recess 216 when a wafer is secured to the carrier 206. Generally, the plating solution is allowed to enter the chamber during the plating process. When the carrier 206 is transferred from a plating cell to a subsequent cell, the plating solution exits the chamber via a drainage port 224.

The carrier 206 further includes a horizontal port 226 to allow the plating solution to exit the plating cell as it flows from a bottom portion of the plating cell to an upper portion of the plating cell. Vertical grooves (guides) 228, 230 are located at the front face 212. The vertical grooves 228, 230 are adjacent to opposite sides of the circular recess 216 to channel the acid and/or water during the pre/post-treatment and rinse processes. In other words, the acid and/or water is not allowed to flow beyond the grooves 228, 230 by directing the acid and/or water into the grooves 228, 230 and vertically channeling the same downwardly along the grooves 228, 230 by gravity. As such, the escape of acid and/or water through inlet opening 232 and outlet opening 234 of the pre-treatment/rinse cells 236 is minimized.

The cathode assembly 210 includes a pair of rods 238, 240 rotatively coupled to the carrier 206, wherein the rods 238, 240 are located at opposite sides of the carrier 206. Each rod 238, 240 includes a pair of contact pins 242, 244, 246, 248 extending outwardly and oriented transverse to the respective rod 238, 240. Of course, the cathode assembly 210 may be configured to include more or less than four (4) contact pins. The rods 238, 240 and pins 242, 244, 246, 248 are formed from an electrically conductive material such as copper to provide a conductive path from the cathode power supply to the wafer to be plated. In order to prevent plating of the rods 238, 240 and contact pins 242, 244, 246, 248, the rods 238, 240 and contacts pins 242, 244, 246, 248 and in order to minimize the undesirable effects of plating the cathode assembly 210 such as "shadowing." Only the tip portion 250 of each contact pin 242, 244, 246, 248 is left uncoated to provide electrical contact with the wafer. It is noted that the surface of the rods and contact pins may be electrically insulated from the plating solution with a sleeve, jacket, paint, tubing or the like. Each rod 238, 240 includes a gear 252, 254 which couples with a drive mechanism to rotate the cathode assembly 210. The contact open/close mechanism 203 for rotating the cathode assembly 210 is described in greater detail below. When the cathode assembly 210 is in the unsecured position, the rods 238, 240 are rotated such that the contact pins 242, 244, 246, 248 are oriented substantially perpendicular (slightly obtuse) to the front surface 212 of the carrier 206 as shown in FIG. 2B. To position the cathode assembly 210 in the secured position, the drive mechanism engages with the gears 252, 254 and the rods 238, 240 are rotated such that the contact pins 242, 244, 246, 248 are oriented substantially parallel to the front surface 212 of the carrier 206 as shown in FIG. 2A. To minimize the effects of "shadowing," the contact pins 242, 244, 246, 248 are configured so that the tip portion 250 contacts the periphery of the wafer. A detent tensioner 256 is coupled to each of the rods 238, 240 to maintain the cathode assembly in the secured position during subsequent processing procedures.

The belt-to-carrier-coupling 208 includes a base 258 having one end removably secured to the carrier 206 by screws such that the carrier 206 may be readily removed from the wafer processing system 100 for maintenance purposes and/or to replace the carrier 206 with an alternative carrier for plating other types of substrates. One end of a roller assembly 260 is pivotally coupled to the base 258 by a bore and shaft arrangement to allow the carrier 206 to rotate from a vertical orientation to a horizontal orientation and from the horizontal orientation to the vertical orientation. The other end of the roller assembly 260 is secured to the drive belt 261 of the carrier transport system 102. The roller assembly 260 has a pair of lower rollers 262, 264 and an upper roller 266 which are rotatively coupled to an arm 268. The pair of lower rollers 262, 264 ride along a lower vee track 270 and the upper roller 266 rides along an upper vee track 272. The upper roller 266 is vertically adjustable to minimize play between the rollers 262, 264, 266 and the tracks 270, 272. With such an arrangement, the rack 202 may be smoothly transported along the track. In this particular embodiment, the upper roller 266 is rotatably coupled to a shaft which is slidingly coupled to a vertical slot 274 of the arm 268. As such, the upper roller 266 may be adjusted towards the upper vee track 272 until the rollers 262, 264, 266 contact their respective tracks 270, 272 with sufficient force.

The contact open/close mechanism 203 for rotating the cathode assembly 210 in the open position as shown in FIG. 2B and the secured position as shown in FIG. 2C. The contact open/close mechanism 203 includes an actuator 278 which moves a support arm 280 vertically upwards and downwards. A gear rack 282, 284 extends outwardly from each end of the support arm 280. When in the fully "upward" position as shown in FIG. 2C, the gear racks 282, 284 are disengaged from the gears 252, 254 of the cathode assembly 210, and the contact pins 242, 244, 246, 248 are in the secured position. The gear racks 282, 284 engage with the gears 252, 254 as they are moved downwardly by the actuator 278 such that downward movement of the gear racks 282, 284 cause the gears 252, 254 and rods 238, 240 to rotate and the contact pins 242, 244, 246, 248 to move towards the open position. When the drive mechanism 278 is at the fully "downward" position as shown in FIG. 2A, the contacts pins 242, 244, 246, 248 are similarly in the full open position. After the wafer is loaded onto the carrier 206, the contact open/close mechanism 203 is moved from the fully "downward" position to the fully "upward" position and the contact pins 242, 244, 246, 248 are moved to the secured position. At the secured position, the cathode assembly 210 remains locked in the secured position by the detent tensioner 256 and the tip portion 250 of each contact pin 242, 244, 246, 248 remains engaged with the surface of the wafer. It is noted that the cathode assembly 210 and contact open/close mechanism 203 are configured to enable each tip portion 250 to softly engage with the wafer to prevent wafer breakage.

FIGS. 3A–3C show an alternative rack 300 and contact open/close mechanism 302 in accordance with the present invention. The rack 300 includes a carrier 304, belt-to-carrier coupling 306, and a cathode assembly 308. The carrier 304 and belt-to-carrier coupling 306 are identical to the carrier 206 and belt-to-carrier coupling 208 illustrated in FIGS. 2A–2F. The cathode assembly 308 is essentially the same as the cathode assembly 210 shown in FIGS. 2A–2F with the exception that the gears 252, 254 are replaced with cross pins 310, 312. The contact open/close mechanism 302 includes a base 315 horizontally movable towards and away from the rack 300. The base 315 has an actuator 314 which rotates a pair of arms 316, 318 having a slotted collet 320, 322 at the distal end, The slotted collets 320, 322 are configured to engage with the respective cross pins 310, 312 of the cathode assembly 308 as shown in FIG. 3C. Referring to FIG. 3A, the contact open/close mechanism 302 is in the retracted position and the cathode assembly 308 is in the secured position, wherein the contact pins 242, 244, 246, 248 are oriented parallel to the front surface of the carrier 304. When the contact open/close mechanism 302 is in the extended position, the slotted collets 320, 322 engage with the cross pins 310, 312. The arms 316, 318 are then rotated by the actuator 314 to rotate the rods 238, 240 and move the contact pins 242, 244, 246, 248 to the unsecured position as shown in FIG. 3B. After the wafer is loaded onto the carrier 304, the arms 316, 318 are rotated in the opposite direction to move the contact pins 242, 244, 246, 248 to the secured position, wherein the tip portions 250 engage with the surface of the wafer. The contact open/close mechanism 302 is then move to the retracted position, wherein the slotted collets 320, 322 disengage with the cross pins 310, 312. The tip portions 250 are urged to remain engaged with the surface of the wafer by the detent tensioner 256 during subsequent processing steps.

Figure 4A:
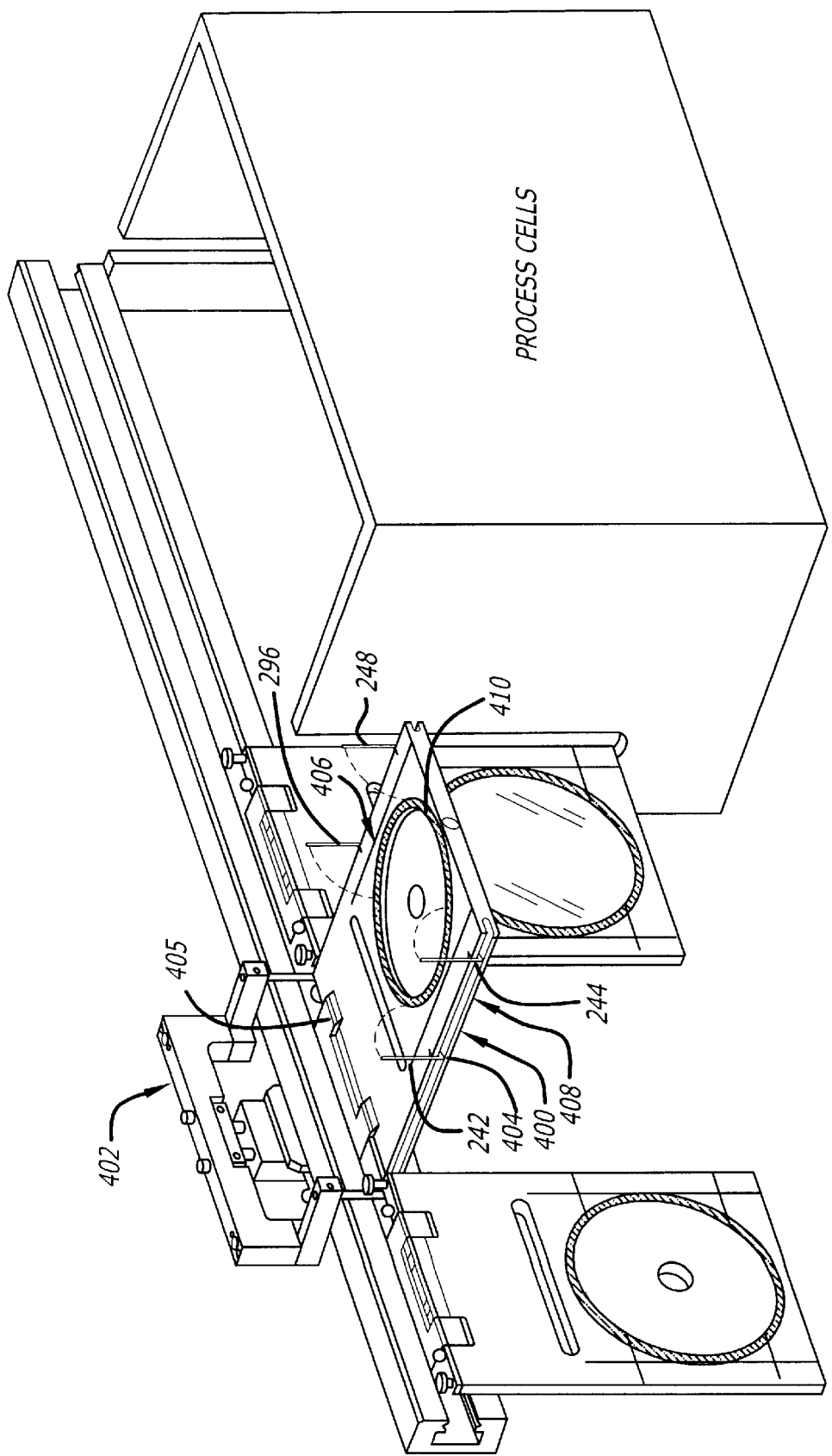
FIGS. 4A and 4B illustrate front perspective views of a third exemplary wafer carrier in accordance with the invention.
Figure 4B:
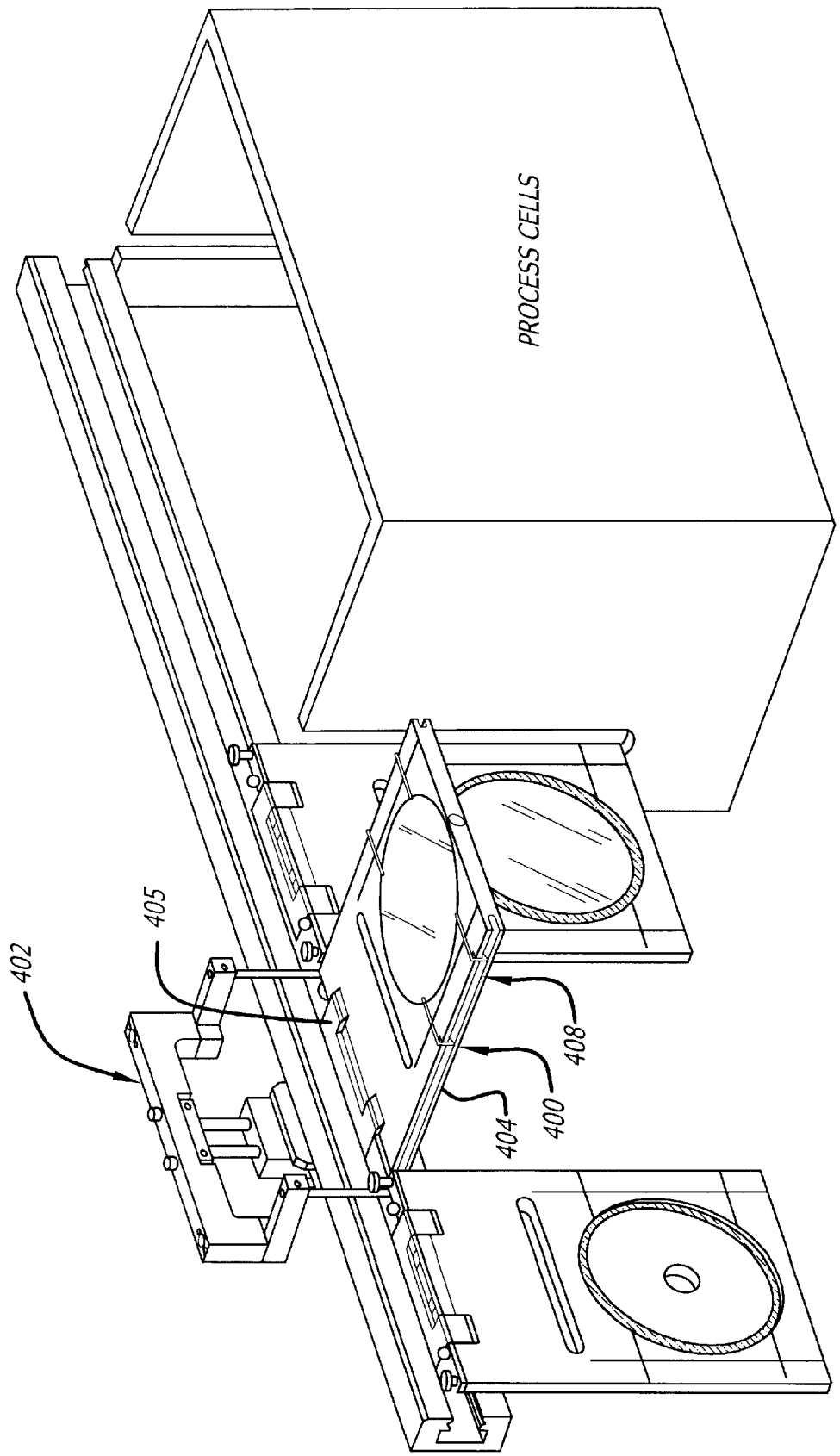
Figure 4C:
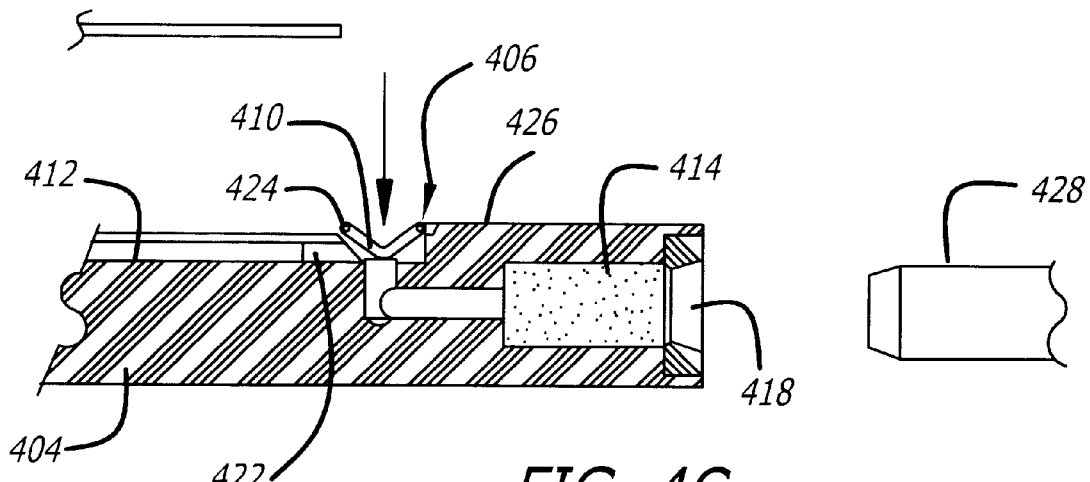
FIG. 4C illustrates a cross-sectional view of the third exemplary wafer carrier with vacuum being applied on a seal in accordance with the invention.
Figure 4D:
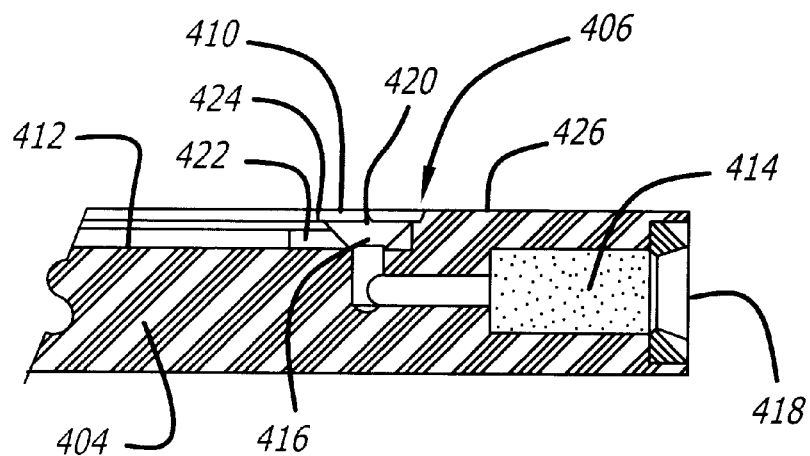
FIG. 4D illustrates a cross-sectional view of the third exemplary wafer carrier without vacuum being applied on the seal in accordance with the invention.

FIGS. 4A–4D illustrate another alternative rack 400 and contact open/close mechanism 402 in accordance with the present invention. The rack 400 includes a carrier 404, belt-to-carrier coupling 405, and cathode assembly 408. The belt-to-carrier coupling 405 and cathode assembly 408 are identical to the embodiment shown in FIGS. 2A–2F, while the carrier 404 is essentially the same as the embodiment shown in FIGS. 2A–2F with the exception that a wafer scaling mechanism 406 is used to isolate the backside of the wafer from the plating solution. The sealing mechanism 406 has a flexible ring 410 disposed at the outer periphery of a circular recess 412, and a channel 414 connects an inner chamber 416, which is disposed between the backside of the wafer and the circular recess 412, to a port 418. The port 418 is located at the edge (side which attaches to the belt-to-carrier coupling 405) of the carrier 404. The flexible ring 410 may be formed from a resilient and flexible material such that the outer flat surface as shown in FIG. 4D is capable of being urged into a V-shaped structure as shown in FIG. 4C when a vacuum is formed in the inner chamber 416. A notch 420 is disposed at the inner surface of the flexible ring 410 to facilitate the formation of the V-shaped outer surface. A contact ridge 422 supports the periphery of the wafer and prevents a major portion of the backside from contacting the carrier 404. A lip 424 is parallel to the front surface 426 of the carrier 404 when the outer surface of the flexible ring 410 is in the flat state, and the lip 424 is angled upwardly relative to the front surface 426 when the outer surface of the flexible ring 410 is in the V-shaped state.

The contact open/close mechanism 402 is essentially identical to the embodiment shown in FIGS. 2A–2D with the exception that a vacuum nozzle 428 couples with the port 418 of the carrier 406 when the sealing mechanism 402 is in the fully "downward" position as shown in FIG. 4A. At the fully "downward" position, the cathode assembly 408 is in the unsecured position, wherein the contact pins 242, 244, 246, 248 are oriented substantially perpendicular and the lip 424 is angled upwardly relative to the front surface 426 of the carrier 404. As stated previously, vacuum is created in the inner chamber 416 via the channel 414, port 418, vacuum nozzle 428, and a vacuum source (not shown). The wafer is loaded onto the carrier 404, and the vacuum in the inner chamber 416 is terminated such that the lip 424 returns to the position parallel to the front surface 426 of the carrier 404. While returning to the parallel position, the lip 424 covers the frontside (peripheral portion) of the wafer. At this state, the wafer is secured to the carrier by the flexible ring 410. As shown in FIG. 4B, the contact open/close mechanism 402 is then moved from the fully "downward" position to the fully "upward" position and the contact pins 242, 244, 246, 248 are moved to the secured position. At the secured position, the cathode assembly 408 remains located in the secured position by the detent tensioner 256, and the tip portion 250 of each contact pin 242, 244, 246, 248 remains engaged with the frontside of the wafer.

FIGS. 5A–5C illustrate an alternative carrier transport system 500 in accordance with the present invention. The carrier transport system 500 is identical to the system shown in FIGS. 2A–2F with the exception that a carrier 502 includes three opening 504, 506, 508 at a recess 510 which allow three posts 512, 514, 516 to pass through the carrier 502.

IV. Pre- or Post-Treatment Process Cell

Figure 6B:
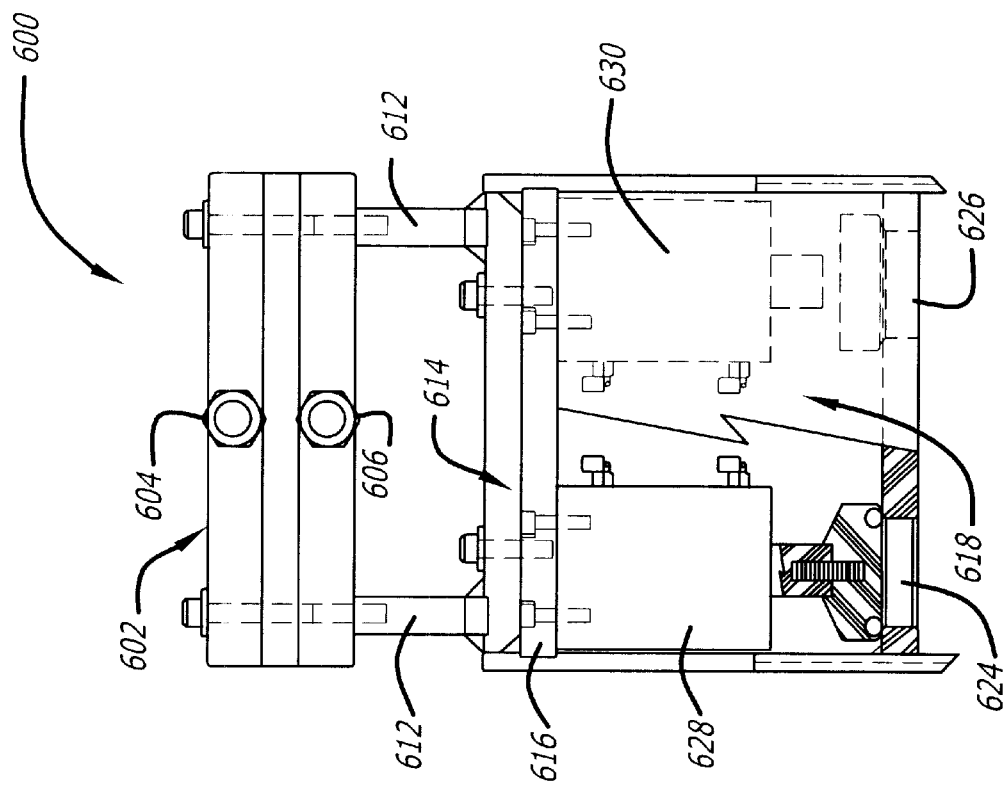
FIGS. 6A–B illustrate side and front views of an exemplary pre-treatment or post-treatment process cell in accordance with the invention.
Figure 6A:
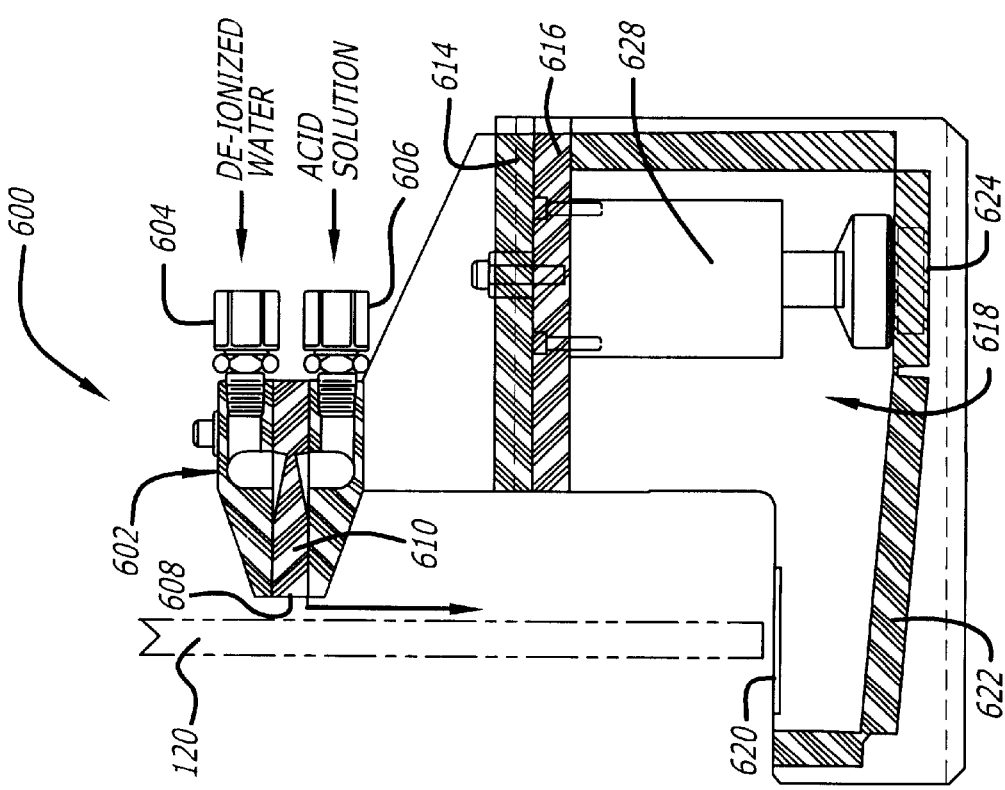

FIGS. 6A–B illustrate side and front views of an exemplary pre-treatment process cell 600 in accordance with the invention. The pre-treatment process cell 600 performs an acid rinse on the wafer to remove oxides and/or other contaminants that may reside on the plating surface of the wafer. In addition, the pre-treatment process cell 600 also performs a de-ionized rinse of the wafer to remove the acids off the wafer prior to plating process being performed on the wafer.

The exemplary pre-treatment process cell 600 comprises a nozzle 602 having two inputs 604 and 606, a common output 608, and a valve 610 to selectively couple one of the inputs 604 or 606 to the common output 608. The first input 604 of the nozzle 602 may serve as an input for de-ionized water, and the second input 606 of the nozzle 602 may serve as an input for acid solution. The nozzle 602 is mechanically supported on a base 614 via two supporting members 612 situated on either side of the nozzle 602. The base 614 is disposed on atop wall 616 of a sump 618.

The sump 618 comprises an inlet 620 situated under a carrier 120 and the output 608 of the nozzle 602 in order to allow the passage of used acid solution and de-ionized water into the sump 618. As previously discussed with reference to the carrier 120, the carrier 120 has fluid flow guides to help guide the flow of the used acid solution and the de-ionized water to the sump inlet 620. The sump inlet 620 is situated over an inclined bottom section 622 in order to force by gravity the flow of the used acid solution and de-ionized water respectively towards the acid solution drain 624 and the de-ionized water drain 626. A pneumatic acid solution drain valve 628 is situated above the acid solution drain 624 to selectively allow drain acid solution to flow out of the sump 618 through the acid solution drain 624. Also, a pneumatic de-ionized drain valve 630 is situated above the de-ionized water drain 626 to selectively allow de-ionized water to flow out of the sump 618 through the de-ionized water drain 626.

Typically, the pre-treatment process on a wafer requires less time than the plating and/or other processes being performed on wafers at other process cells. It follows then that if the pre-treatment process begins at the same time as the plating and/or other processes performed on wafers at other process cells, then there will be a time period in which the wafer at the pre-treatment process cell remains idle. In this time period, oxidation of the plating surface of a wafer may form which can lead to defects in the plating deposition formed on the wafer. Thus, in order to reduce or prevent oxidation of the wafer, the pre-treatment process begins approximately at the next indexing time minus the pre-treatment process time. In this way, indexing of the wafer to the next process cell occurs immediately after the completion of the pre-treatment process, thereby avoiding or preventing idle time which can have adverse effects on the overall process.

The operation of the pre-treatment process is as follows. At the time the pre-treatment process begins, the pneumatic acid solution drain valve 628 is positioned to fluid couple the sump 618 to the acid solution drain 624 and the de-ionized water drain valve 630 is positioned to fluidly de-couple the sump 618 from the de-ionized drain 626. Then, the valve 610 of the nozzle 602 is actuated to fluidly couple the acid solution input 606 to the output 608 of the nozzle 602, thereby allowing acid solution to treat the wafer vertically mounted on the carrier 120. After treating the wafer, the used acid solution flows downwards through the sump inlet 620, down the inclined bottom portion section 622 of the sump 618, and out the sump 618 through the acid solution drain 624.

Once the acid treatment on the wafer is completed, the pneumatic acid solution drain valve 628 is positioned to fluid de-couple the sump 618 from the acid solution drain 624 and the de-ionized water valve 630 is positioned to fluidly couple the sump 618 to the de-ionized drain 626. Then, the valve 610 of the nozzle 602 is actuated to fluidly couple the de-ionized water input 604 to the output 608 of the nozzle 602, thereby allowing de-ionized water to rinse the wafer vertically mounted on the carrier 120. After the de-ionized water rinses the wafer, the used de-ionized water flows downwards through the sump inlet 620, down the inclined bottom portion section 622 of the sump 618, and out the sump 618 through the de-ionized water drain 626. Immediately after the de-ionized rinsing of the wafer is completed, the carrier 120 is indexed to the next process cell.

V. Electroplating Process Cell

Figure 7:
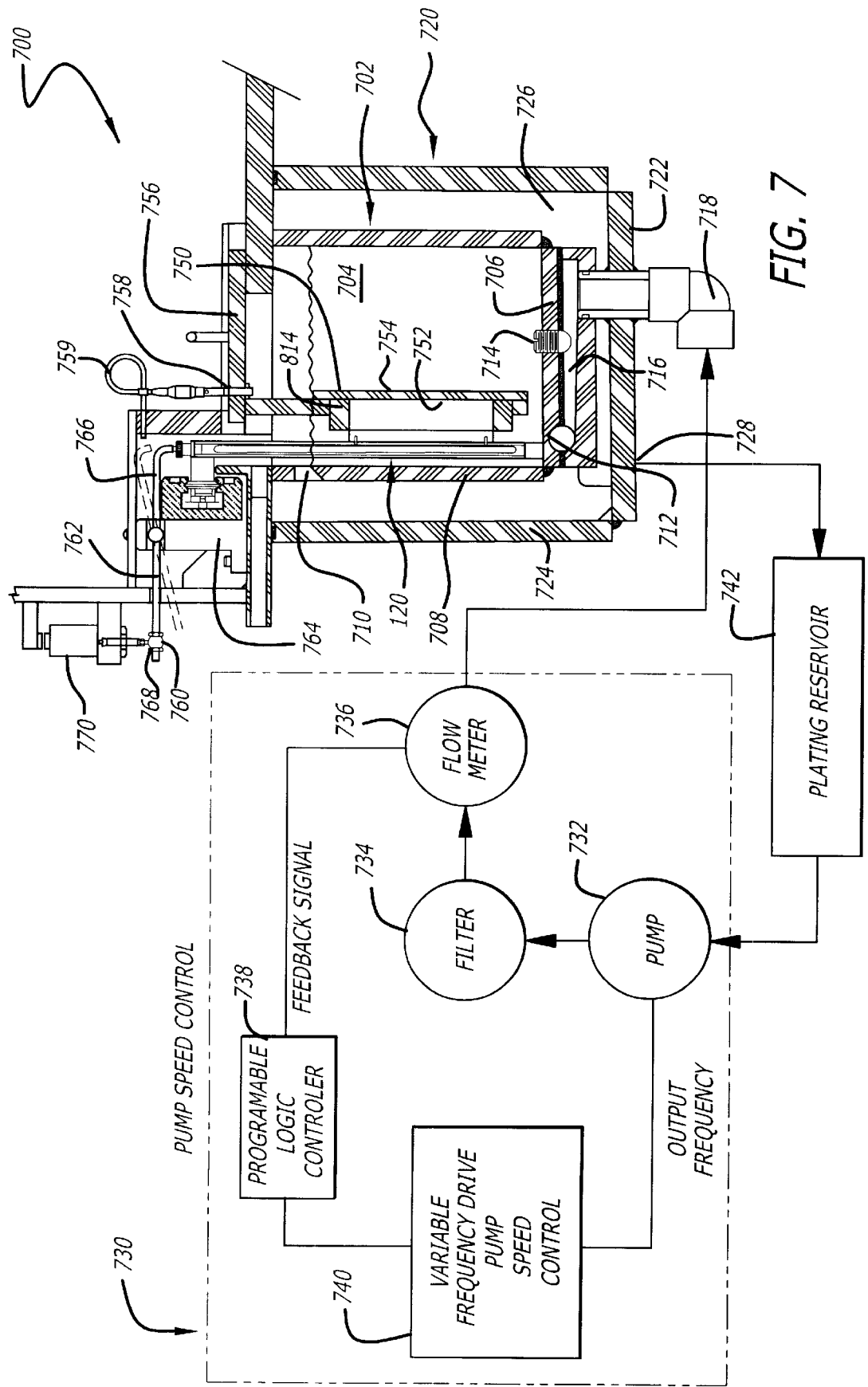
FIG. 7 illustrates a side view of an exemplary plating process cell in accordance with the invention.

FIG. 7 illustrates a cross-sectional—block diagram view of an exemplary electroplating process cell 700 in accordance with the invention. In the exemplary electroplating process cell, electroplating of a vertically-oriented wafer mounted on a carrier 120 occurs. As will be discussed in further detail below, several features of the exemplary electroplating process cell 700 are designed to make the plating process relatively fast. This is done so that the wafer processing system 100 of the invention can compete, processing time-wise, with prior art electroplating equipment that perform parallel plating of wafers.

The exemplary electroplating process cell 700 comprises an inner container 702 for supporting a plating solution bath 704. The inner container 702 comprises a bottom 706 and a wall 708 having an overflow opening 710. The bottom 706 of the inner container 702 includes an inlet 712 to allow the introduction of plating solution into the inner container 702. The bottom 706 of the inner container 702 also includes therethrough a manually-adjustable flow valve 714 that extends into a fluid duct 716 situated under the inner container 702. The manually-adjustable flow valve 714 is provided to selectively adjusts the flow rate of the plating solution in the inner container 702. One or more pipes and fittings referred to generally as pipe 718 is provided to fluidly couple the plating pump system 730 to the inner container 702 by way of the pipe 718, the fluid duct 716, and the inner container inlet 712.

The exemplary electroplating process cell 700 further comprises an outer container 720 that encompasses within the inner container 702. The outer container 720 comprises a bottom 722 and at least one wall 724 that surrounds the inner container 702. The space between the wall 708 of the inner container 702 and the wall 724 of the outer container 720 define an overflow duct 726 that leads down to a drain 728 at the bottom 722 of the outer container 720. The overflow duct 726 is fluidly coupled to the inner container 702 by way of the overflow opening 710 through the wall 708 of the inner container 702. The overflow duct 726 is also fluidly coupled to a plating solution reservoir 742 by way of the drain 728 at the bottom 722 of the outer container 720. The pipe 718 may be routed through the bottom 722 of the outer container 720.

The plating pump system 730 comprises a pump 732, a filter 734, a flow meter 736, a programmable logic controller 738, and a variable frequency drive pump speed control 740. The pump 732 causes the flow of plating solution from the plating reservoir 742 to the inner container 702. The filter 734 removes contaminants that may be present in the plating solution. The flow meter 736 generates a feedback signal indicative of the flow rate of the plating solution to the inner container 702. The programmable logic control 738 receives the flow rate feedback signal and sends a control signal to the pump speed control 740 to maintain the flow rate of the plating solution to the inner container 702 within a desired specification. The pump speed control 740 receives the control signal from the programmable logic controller 738 and provides a corresponding signal that controls the frequency of the pump 732.

The exemplary electroplating process cell 700 further comprises an anode assembly 750 comprising a vertically-oriented planar anode electrode 752 mounted on a frame 754. The frame 754 is mounted on a cross-member 756 that has an electrical connector 758 extending therethrough, The electrical connector 758 electrically couples a wire 759 that carries the anode voltage to the anode 752. The exemplary electroplating process cell 700 also comprises a cathode assembly 760 comprising an electrically-conductive rod 762 that is pivotably mounted on a fixed member 764. The rod 762 includes a contact end 766 for making electrical contact to the gears (252, 254) or cross-pins (310, 312) on the carrier 120 and an opposing end that is coupled to a lift actuator 770 for pivoting the rod 762 about its pivot point. The lift actuator 770 contact to the rod 762 is at a negative voltage potential (e.g. ground potential) with respect to the voltage applied to the anode electrode 752.

In operation, prior to a new carrier 120 being indexed into the electroplating process cell, the inner container 702 supports a plating solution, the pump system 730 is continuously supplying plating solution to the inner container 702, and the cathode 762 is positioned such that it is in its counter-clockwise position. Then, a carrier 120 supporting a vertically-oriented wafer is indexed into the electroplating process cell 700. The indexing of the carrier 120 into the electroplating process cell 700 horizontally aligns the anode with the wafer. That is, at the indexed position, the anode and the wafer are substantially coaxially aligned.

Once the carrier 120 is properly indexed into the electroplating process cell 700, the lift actuator 770 is actuated to rotate the cathode rod 762 clockwise about its pivot to have its contact end electrically contact the gears (252, 254) or cross-pins (310, 312) of the carrier 120. Then, a plating voltage difference between the anode and the wafer is formed to cause the plating of the surface of the wafer. The inlet 712 to the inner container 702 is situated to inject fresh plating solution generally parallel to and near the plating surface of the wafer. In this manner, a higher plating rate can be achieved.

As previously mentioned, the exemplary electroplating process cell 700 of the invention incorporates techniques to increase the plating rate of the wafer. This is done so that the wafer processing system 100 of the invention can compete with prior art wafer processing equipment that perform plating of multiple wafers in parallel. One technique is the use of the pump system 730 which delivers substantially non-turbulent plating fluid flow into the inner container 702. It does this by accurately controlling the flow rate of plating fluid into the inner container 702. The pump system 730 accomplishes this by having the programmable logic controller 738 receive the feedback signal developed by the flow meter 736 to accurately monitor the flow rate into the inner container 702 and then to develop a control signal to adjust the frequency of the pump 732 to maintain the flow rate within a desired specification. This feedback system prevents the occurrence of cavitation at the pump 732.

Another technique employed by the exemplary electroplating process cell 700 of the invention is the use of particular anode designs that reduces plating non-uniformity across the surface of the wafer. One way to achieve a relatively high plating rate is to form a relatively large voltage difference between the anode and the wafer. However, such a relatively large plating voltage typically results in non-uniform deposition across the surface of the wafer due non-uniform plating currents across the surface of the wafer. In order to counter this, the particular anode designs are provided to make more uniform the plating currents across the surface of the wafer, thereby allowing higher plating voltages to be used without significantly affecting the uniformity of the plating deposition across the surface of the wafer.

Figure 8:
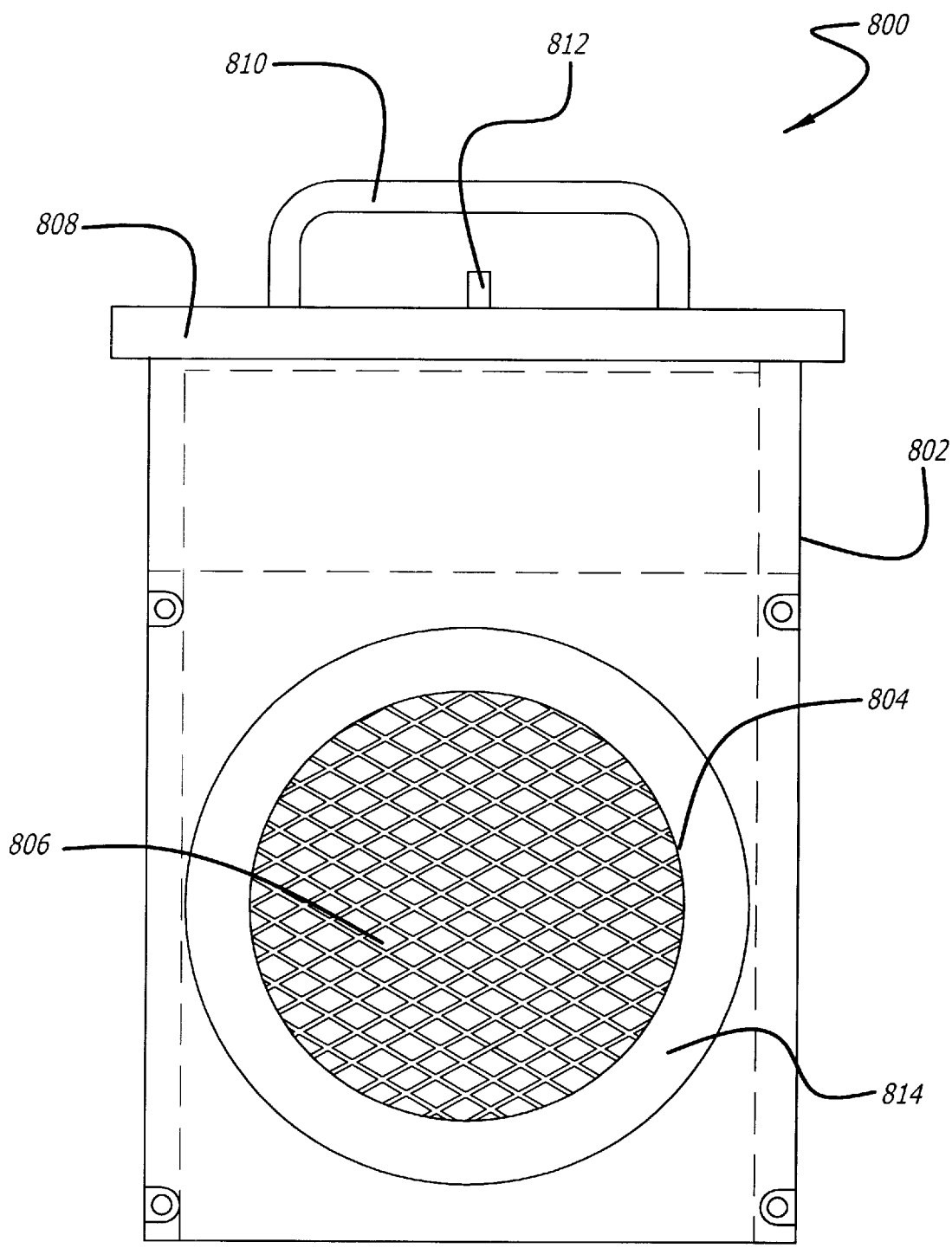
FIG. 8 illustrates a front view of an exemplary anode with shield in accordance with the invention.

FIG. 8 illustrates a front view of an exemplary anode assembly 800 in accordance with the invention that is particularly useful in improving the uniformity of the plating current distribution across the surface of the wafer. The anode assembly 800 comprises a planar frame 802 having an opening 804 for accommodating a planar anode electrode 806 therein. A cross member 808 having a handle 810 and an electrical connector 812 may be mounted on the top of the frame 802. The electrical connector 812 is used to apply an anode voltage to the anode electrode 806. In order to improve the uniformity of the plating deposition across the surface of the wafer, the anode assembly 800 further comprises a shield 814 disposed on the frame 802 coaxially around the anode electrode 806. The shield 814 extends outwardly from the anode electrode 806 as shown in FIG. 7. The helps in columnizing the plating currents towards the wafer surface thereby improving the uniformity of the plating deposition across the surface of the wafer.

Figure 9:
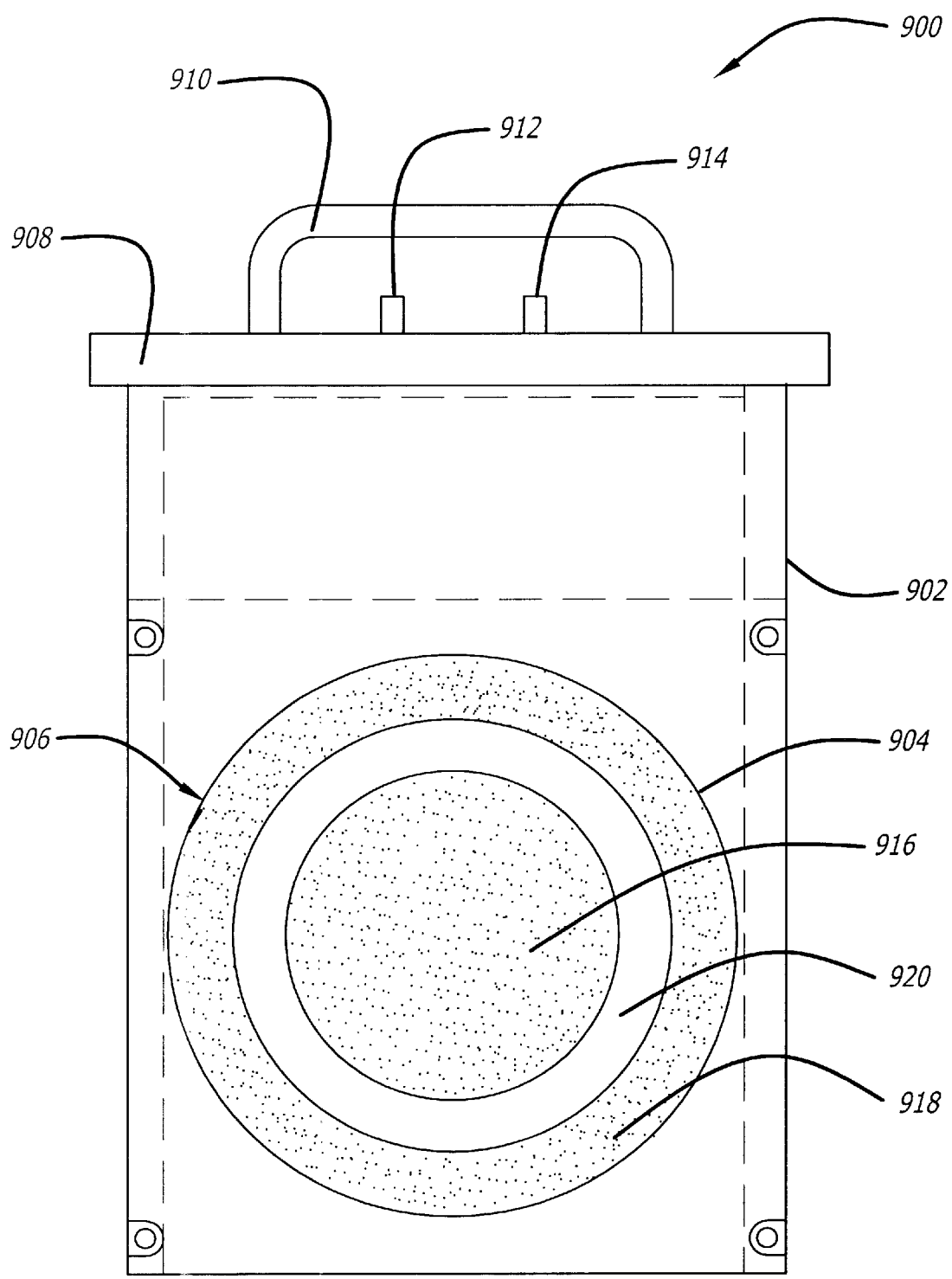
FIG. 9 illustrates a front view of a segmented anode in accordance with the invention.

FIG. 9 illustrates a front view of another exemplary anode assembly 900 in accordance with the invention that is particularly useful in improving the uniformity of the plating current distribution across the surface of the wafer. The anode assembly 900 comprises a planar frame 902 having an opening 904 for accommodating a planar segmented anode electrode 906 therein. A cross member 908 having a handle 910 and two electrical connectors 912 and 914 may be mounted on the top of the frame 902. In order to improve the uniformity of the plating deposition across the surface of the wafer, the planar segmented anode electrode 906 comprises two separately excitable sections 916 and 918 being separated from each other by an electrical insulating or resistive section 920. The separately excitable anode section 916 and 918 can be excited respectively by two different anode voltages applied by way of the two electrical connectors 912 and 914. The segmented anode electrode 906 can address plating non-uniformity across the surface of the wafer by applying different voltages respectively to the separately excitable sections 916 and 918 so as to better equalize the plating currents across the surface of the wafer. The sections 916 and 918 can be excited with separate power supplies, a single power supply with two regulators, or a single power supply to one of the section and a resistive element coupling the power to the other section.

VI. Seal Between Adjacent Process Cells

As previously discussed, an aspect of the process methodology and the wafer plating system of the invention is the horizontal transport of carriers supporting vertically-oriented wafers. The horizontally transported carriers enter and exit process cells through inlet and outlet openings at the side walls of the process cell. Typically, adjacent process cells share a common wall. In such a case, the outlet opening of a process cell is the inlet opening of the adjacent cells. In order to minimize leakage of liquid of a process cell into an adjacent process cell, a unique seal has been developed in accordance with the invention.

Figure 10:
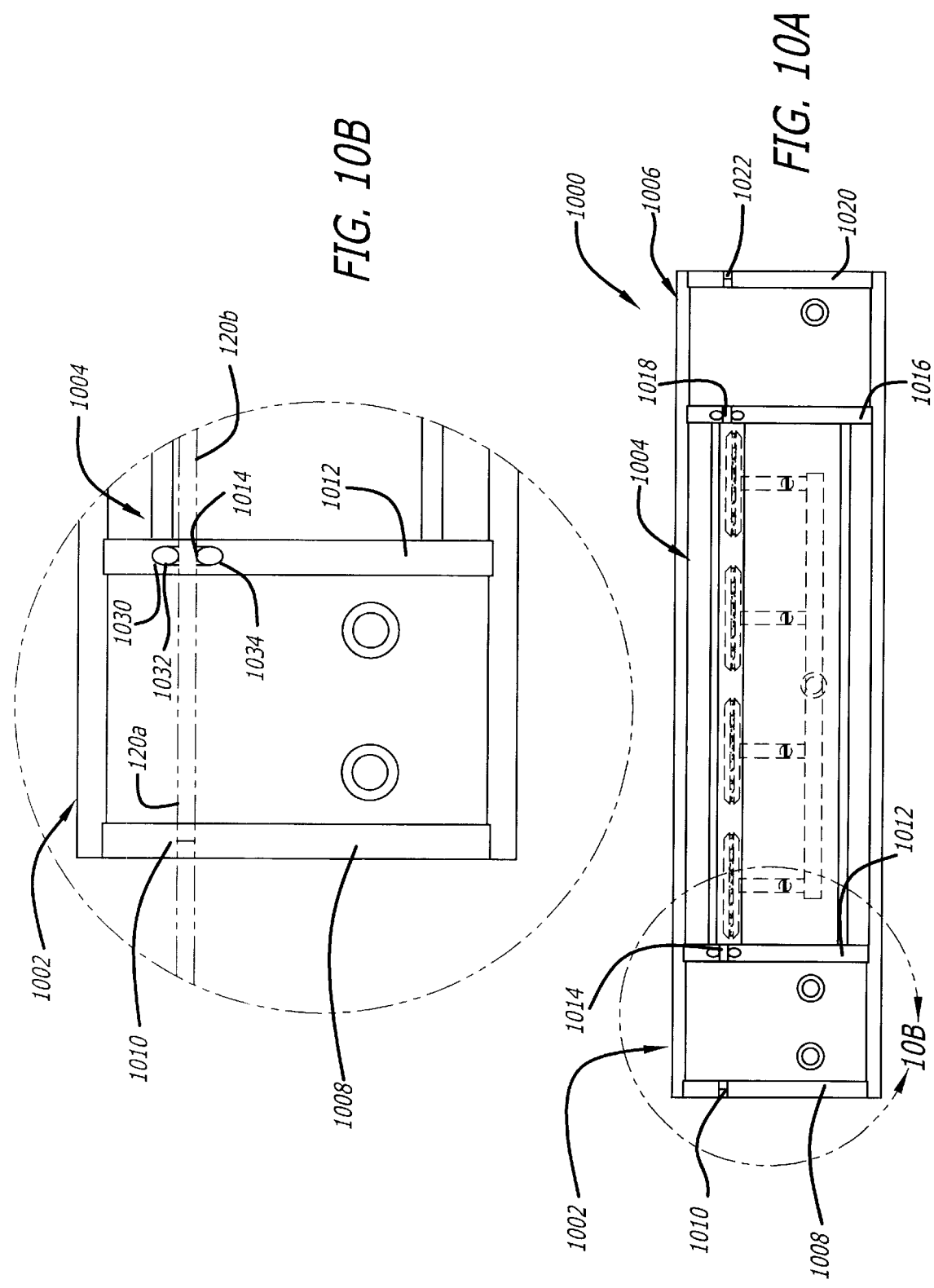
FIGS. 10A–B illustrate top and blown-up views of an exemplary seal between adjacent process cells in accordance with the invention.

FIG. 10A illustrates a top view of an exemplary wafer process section 1000 in accordance with the invention. The wafer process section 1000 comprises a first process cell 1002, a second process cell 1004 adjacent to the first process cell 1002, and a third process cell 1006. In this example, the first process cell 1002 has a length of one index distance, the second process cell 1004 has a length of four index distances, and the third process cell 1006 has a length of one index distance. The first process cell 1002 has a first wall 1008 having an inlet opening 1010 to allow the entrance of a carrier therethrough and a second wall 1012 having an outlet opening 1014 to allow the exit of a carrier therethrough. The second wall 1012 is common to both the first process cell 1002 and the second process cell 1004. Thus, the outlet opening 1014 of the first process cell 1002 serves as the inlet opening for the second process cell 1004. Similarly, a common wall 1016 separates the second process cell 1004 from the third process cell 1006, where the common wall 1016 includes an opening 1018 that servers as the outlet for the second process cell 1004 and the inlet for the third cell 1006. The third process cell 1006 also has another wall 1020 with an outlet opening 1022.

Different processes may be performed respectively within the first, second and third process cells 1002, 1004, and 1006. Each of the different process may use different liquids. For example, the first process cell 1002 may be configured to pre-treat a wafer by treating it with acid solution to remove oxides from the surface of the wafer and then to rinse the wafer with de-ionized water. The second process cell 1004 may be configured to electroplate the surface of the wafer using plating solution. And, the third process cell 1006 may be configured to post-treat the wafer by rinsing it with de-ionized water and subsequently drying it. If care is not taken, leakage of liquid used in a process cell to one or more adjacent cells may cause contamination of the various process being performed on the wafer, which can lead to defects and other adverse consequences. Therefore, an aspect of the invention relates to a unique seal 1030 that minimizes leakage of liquid from a process cell into an adjacent process cell.

FIG. 10B illustrates a blown-up top view of the encircled portion of the exemplary wafer process section 1000 shown in FIG. 10A. The first process cell 1002 has a first carrier 120a properly indexed therein and the second process cell 1004 has a second carrier 120b properly indexed therein. When both the first and second carriers 120a–b are properly indexed, their respective ends are situated within the opening 1014 of the common wall 1012 of the first and second process cells 1002 and 1004. The spacing between the adjacent carriers 120a–b is relatively small, for example, a sixteenth (1/16) of an inch. In addition, the spacing between the carriers 120a–b and the wall 1012 is also relatively small, for example, a sixteenth (1/16) of an inch. Thus, a first aspect of the seal 1030 of the invention is that adjacent carriers 120a–b occupy substantially a large portion of the opening 1014 between adjacent process cells, thereby preventing a substantial amount of cross leakage between process cells.

Another aspect of the seal 1030 of the invention is a pair of elongated groves 1032 and 1034 formed within the common wall 1012 on both sides of the opening 1014. The grooves 1032 and 1034 extend vertically along the wall at least the height of the carriers 120a–b and down to a common sump area with a drain (not shown). Any liquids that manages to leak out the process cells through the spacing between the carriers 120a–b and the wall 1012 are captured by the grooves 1032 and 1034. The radial surface of the grooves 1032 and 1034 substantially slows the velocity of the liquids allowing the liquids to flow downward down the groove walls to the sump area for proper drainage of the leaked liquids. Thus, the seal 1030 of the invention substantially reduces leakage between adjacent process cells.

VII. Carrier Process Section

As previously discussed, the various processes performed on the wafers may have adverse consequences on the carriers since the carriers are also exposed to the various processes. The wafer processing system 100 of the invention includes the carrier process section 110 in order to treat empty carriers 120 after carrying the wafers through the wafer process section 106. In particular, during the plating of a wafer, undesired plating deposition may be formed on the wafer cathode contacts that reside on the carriers. The build-up of plating deposition on the wafer cathode contacts, if not removed, may cause damage to wafers that are subsequently loaded on the carrier. Thus, an aspect of the invention relates to a cathode contact stripping cell as part of the carrier process section 110.

Figure 11:
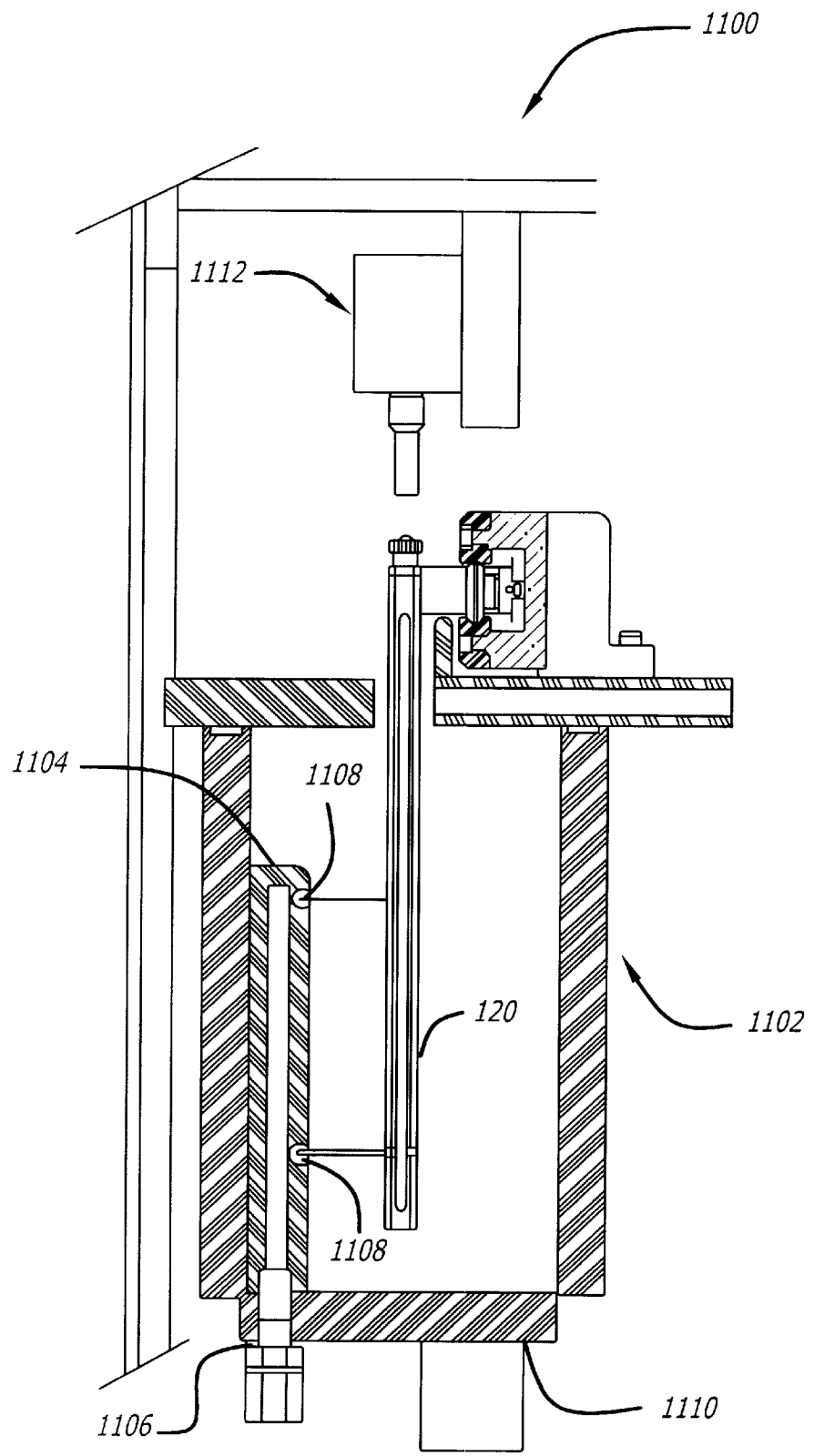
FIG. 11 illustrates a side view of an exemplary cathode contact stripping process cell in accordance with the invention.

FIG. 11 illustrates a side cross-sectional view of a cathode contact stripping cell 1100 in accordance wit the invention. The stripping cell 1100 comprises an enclosure 1102 with carrier inlet and outlet openings as all other process cells of the invention. Situated within the enclosure 1102 is a separate chamber 1104 having an inlet 1106 through the bottom of the enclosure 1102. The chamber 1104 further includes openings 1108 for receiving therein the cathode contact tips of a carrier 120. The enclosure 1102 may further include a drain 1110 at its bottom. In addition, the cathode contact striping cell 1100 further comprises an actuator 1112 for coupling to the gears (252, 254) or cross-pins (310, 312) of the carrier 120 in order to rotate the cathode contacts so that they are extended.

In operation, stripping solution is introduced into the chamber 1104 by way of the inlet 1106. The stripping solution fills the chamber 1004 and exits out the openings 1108 and down to the drain 1110. An empty carrier 120 is then indexed into the cathode contact stripping cell 1100. When the carrier 120 is properly indexed, the actuator 1112 is activated to couple to the gears (252, 254) or cross-pins (310, 312) to rotate the cathode contacts so that they are extended and their tips are situated within the openings 1108. Accordingly, as situated the cathode contact tips are exposed to the striping solution, thereby removing any excess plating deposition on the cathode contact tips. After a pre-determined amount of time (e.g. until before the next carrier index time), the actuator 1112 is activated to couple to the gears (252, 254) or cross-pins (310, 312) to rotate the cathode contacts so that they are retracted. The cathode contact have now been stripped of any excess plating deposition and the carrier can now be indexed into a rinsing and drying process cell.

VIII. Conclusion

The process methodology and process system 100 of the invention have advantages over prior art automatic multi-wafer plating systems as discussed in the Background of the Invention. For instance, the wafers are automatically carried by the carrier transport system from process cell to process cell. This aspect eliminates the need for a centralized robotic wafer loader inserting and removing wafers into and out of process cells. Thus, there is substantially less handling of the wafers during processing, which translates to less defects and contamination. In addition, the process methodology allows for a process equipment 100 that has a backside that can be easily interfaced with a chase room for servicing of the equipment and expelling of unwanted gases and liquids. Other advantages of the process methodology and process system are apparent to those skilled in the art.

Although the process methodology and the process system 100 of the invention has been discussed with reference to the processing of wafers, it shall be understood that it can apply to other planar articles having vertically-oriented surfaces. Such articles may include ceramic substrates, PC boards, flat panel displays, etc.

In the foregoing specification, the invention has been described with reference to specific embodiments thereof It will, however, be evident that various modifications and changes may be made thereto without departing from the broader spirit and scope of the invention. The specification and drawings are, accordingly, to be regarded in an illustrative rather than a restrictive sense.

It is claimed:

1. A method of processing a planar article mounted comprising:

loading said planar article onto a carrier in a manner that said planar article is mounted substantially horizontally on said carrier;

rotating said carrier such that said planar article is mounted substantially vertically on said carrier;

transporting said carrier into a process cell horizontally through an inlet opening of said process cell;

performing a process on said planar article within said process cell, wherein a first portion of said carrier is situated within said inlet opening during the performing of the process on said planar article to prevent leakage of processing fluid out of said process cell through said inlet opening; and transporting said carrier out of said process cell horizontally through an outlet opening of said process cell.

2. The method of claim 1, wherein said process comprises a pre-treatment of said planar article.

3. The method of claim 2, wherein said pre-treatment of said planar article comprises:

subjecting said planar article to an acid solution; and subjecting said planar article to a rinse with de-ionized water.

4. The method of claim 2, wherein said pre-treatment of said planar article begins approximately at a time when said carrier is transported out of said process cell minus the total time of said pre-treatment of said planar article.

5. The method of claim 1, wherein said process comprises an electroplating of a vertically-oriented planar side of said planar article.

6. The method of claim 1, wherein a second portion of said carrier is situated within said outlet opening during the performing of the process on said planar article to prevent leakage of said processing fluid out of said process cell through said outlet opening.

7. A method of processing a planar article mounted substantially vertically on a carrier, comprising:
- transporting said carrier into a process cell horizontally through an inlet opening of said process cell;
- performing a process on said planar article within said process cell, wherein said process comprises an electroplating of a vertically-oriented planar side of said planar article; and
- transporting said carrier out of said process cell horizontally through an outlet opening of said process cell;
- wherein said electroplating of said vertically-oriented planar side of said planar article comprises:
    - providing a planar anode situated substantially vertical, wherein said planar anode is substantially coincident to, substantially faces, and is spaced apart from said vertically-oriented planar side of said planar article;
    - exposing said vertically-oriented planar side to a plating solution bath;
    - directing a stream of plating solution between said planar anode and said vertically-oriented planar side substantially parallel to said vertically-oriented planar side; and
    - forming a plating voltage potential difference between said planar anode and said vertically-oriented plating side of said planar article to plate said vertically-oriented plating side.

8. The method of claim 7, wherein forming said plating voltage potential difference comprises:
- providing a cathode contact rod in electrical contact to a negative terminal of a power supply, wherein said cathode contact rod is pivotally mounted on a fixed member;
- rotating said cathode contact rod from a first position where said cathode contact rod is not electrically connected to said vertically-oriented plating side of said planar article to a second position where said cathode contact rod is electrically connected to said vertically-oriented plating side of said planar article; and
- electrically connecting said planar anode to a positive terminal of said power supply to form said plating voltage potential difference between said planar anode and said vertically-oriented planar side of said planar article.

9. The method of claim 7, wherein said anode comprises first and second separately excitable anode sections and forming said plating voltage potential difference, comprises:
- forming a first voltage potential difference between said first separately excitable section and said vertically-oriented plating side of said planar article; and
- forming a second voltage potential difference between said second separately excitable section and said vertically-oriented plating side of said planar article, wherein said first voltage potential difference is different than said second voltage potential difference.

10. The method of claim 9, wherein forming said first and second voltage differences comprises using different power supplies to respectively form said first and second voltage potential differences.

11. The method of claim 9, wherein forming said first and second voltage differences comprises using a single power supply with first and second voltage regulating circuits to respectively form said first and second voltage potential differences.

12. The method of claim 9, wherein forming said first and second voltage differences comprises using a single power supply with first and second voltage boosts circuits to respectively form said first and second voltage potential differences.

13. The method of claim 9, wherein said anode further comprises a resistive element coupling said first and second separately excitable sections and forming said first and second voltage potential differences comprises electrically connecting said first separately excitable section to a positive supply to form said first voltage potential difference, wherein said second voltage potential difference is derived from a voltage drop across said resistive element.

14. The method of claim 7, further comprising shielding said planar anode to modify an electrostatic field between said planar anode and said vertically-oriented planar side of said planar article.

15. The method of claim 7, wherein directing said stream of plating solution comprises:
- pumping plating solution from a reservoir;
- filtering said pumped plating solution;
- generating a feedback signal indicative of a flow rate of said stream of plating solution;
- generating a flow rate control signal responsive to said feedback signal to maintain said flow rate of said stream of plating solution within a desired specification; and
- generating a speed control signal responsive to said flow rate control signal to control the frequency of said pumping.

16. A method of processing a planar article mounted substantially vertically on a carrier, comprising:
- transporting said carrier into a process cell horizontally through an inlet opening of said process cell;
- performing a process on said planar article within said process cell, wherein a portion of said carrier is situated within an outlet opening during the performing of the process on said planar article to prevent leakage of processing fluid out of said process cell through said outlet opening;
- transporting said carrier out of said process cell horizontally through said outlet opening of said process cell;
- rotating said carrier such that said planar article is mounted substantially horizontally on said carrier; and
- unloading said planar article from said carrier.

17. A method of processing a planar article mounted substantially vertically on a carrier, comprising:
- transporting said carrier into a process cell horizontally through an inlet opening of said process cell;
- performing an electroplating process on said planar article within said process cell, wherein performing said electroplating process comprises:
    - providing a cathode contact rod in electrical contact to a negative terminal of a power supply, wherein said cathode contact rod is pivotally mounted on a fixed member;
    - rotating said cathode contact rod from a first position where said cathode contact rod is not electrically connected to said planar article to a second position where said cathode contact rod is electrically connected to said planar article; and
    - electrically connecting a planar anode to a positive terminal of said power supply to form a plating voltage potential difference between said planar anode and said planar article; and
- transporting said carrier out of said process cell horizontally through an outlet opening of said process cell.

* * * * *